(12) United States Patent
Yaginuma

(10) Patent No.: US 12,738,941 B2
(45) Date of Patent: Sep. 15, 2026

(54) COMMUNICATION DEVICE AND COMMUNICATION SYSTEM

(71) Applicant: TDK Corporation, Tokyo (JP)

(72) Inventor: Tomohiro Yaginuma, Tokyo (JP)

(73) Assignee: TDK CORPORATION, Tokyo (JP)

( * ) Notice: Subject to any disclaimer, the term of this patent is extended or adjusted under 35 U.S.C. 154(b) by 24 days.

(21) Appl. No.: 19/013,109

(22) Filed: Jan. 8, 2025

(65) Prior Publication Data

US 2025/0233591 A1 Jul. 17, 2025

(30) Foreign Application Priority Data

Jan. 16, 2024 (JP) ................................ 2024-004814

(51) Int. Cl.
*H03K 19/0175* (2006.01)
*G06F 13/14* (2006.01)

(52) U.S. Cl.
CPC ......... *H03K 19/0175* (2013.01); *G06F 13/14* (2013.01)

(58) Field of Classification Search
CPC ............................ H03K 19/0175; G06F 13/14
USPC ........... 326/63; 710/100, 113, 305; 709/208, 709/217, 253, 201, 202
See application file for complete search history.

(56) References Cited

U.S. PATENT DOCUMENTS 5,761,697 A * 6/1998 Curry .................... H10W 42/00 710/110
7,650,450 B2 * 1/2010 Soriano ............... G06F 13/4282 710/110
10,063,325 B2 * 8/2018 Tomita ............... H04L 25/4906

FOREIGN PATENT DOCUMENTS

JP 2019-046104 A 3/2019

* cited by examiner

*Primary Examiner* — Arnold M Kinkead
(74) *Attorney, Agent, or Firm* — Oliff PLC

(57) ABSTRACT

A communication device includes a signal generation circuit, a communication interface, and a processing circuit. The signal generation circuit is configured to, based on a first control signal including a first logic level and a second logic level, generate a second control signal including the first logic level and the second logic level. The communication interface is coupled to a communication bus, and is configured to receive an identifier setting command. The processing circuit is configured to set the identifier when the first control signal is at the first logic level and the identifier has not yet been set. The signal generation circuit is configured to: set the second control signal to the second logic level when the processing circuit has not yet set the identifier; and set the second control signal to the first logic level after the processing circuit sets the identifier.

9 Claims, 22 Drawing Sheets

Figure 17:
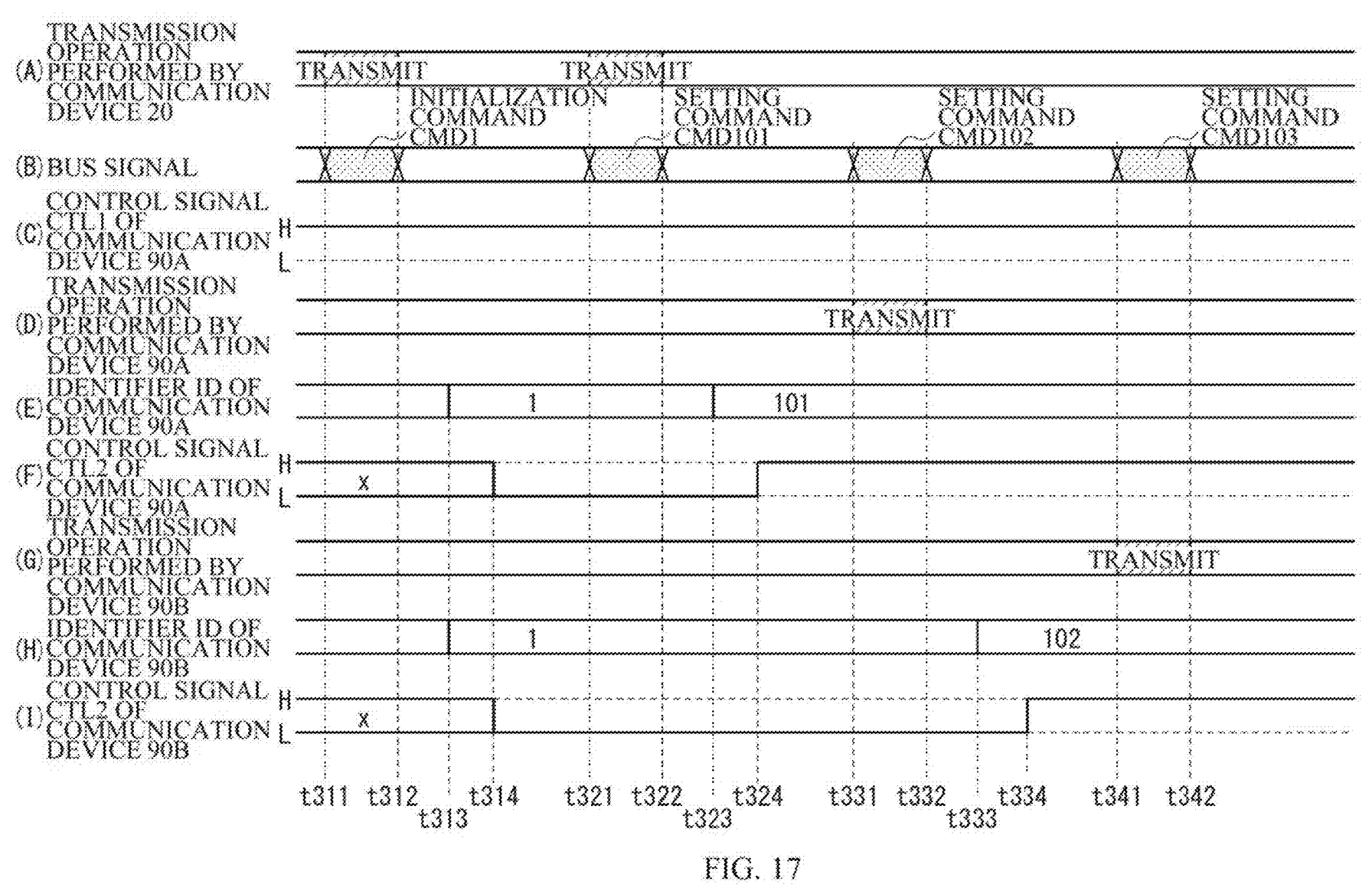

(A) TRANSMISSION OPERATION PERFORMED BY COMMUNICATION DEVICE 20

TRANSMIT

TRANSMIT

INITIALIZATION COMMAND CMD1

SETTING COMMAND CMD101

SETTING COMMAND CMD102

SETTING COMMAND CMD103

(B) BUS SIGNAL (C) CONTROL SIGNAL CTL1 OF COMMUNICATION DEVICE 90A

H

L (D) TRANSMISSION OPERATION PERFORMED BY COMMUNICATION DEVICE 90A

TRANSMIT (E) IDENTIFIER ID OF COMMUNICATION DEVICE 90A

1

101

(F) CONTROL SIGNAL CTL2 OF COMMUNICATION DEVICE 90A

H

L x (G) TRANSMISSION OPERATION PERFORMED BY COMMUNICATION DEVICE 90B

TRANSMIT (H) IDENTIFIER ID OF COMMUNICATION DEVICE 90B

1

102

(I) CONTROL SIGNAL CTL2 OF COMMUNICATION DEVICE 90B

COMMUNICATION DEVICE AND COMMUNICATION SYSTEM

CROSS-REFERENCE TO RELATED APPLICATIONS

The present application claims priority from Japanese Patent Application No. 2024-004814 filed on Jan. 16, 2024, the entire contents of which are hereby incorporated by reference.

BACKGROUND

The disclosure relates to a communication device and a communication system that each perform communication via a communication bus.

Some communication systems cause multiple communication devices to communicate with each other via a communication bus. Such a communication system often performs communication using respective identifiers of the multiple communication devices each coupled to the communication bus. For example, Japanese Unexamined Patent Application Publication (JP-A) No. 2019-46104 discloses a technique of providing a selection circuit that selects one of multiple slave devices each coupled to a bus and setting an identifier of the one of the slave devices selected by the selection circuit.

SUMMARY

A communication device according to one embodiment of the disclosure includes a signal generation circuit, a communication interface, and a processing circuit. The signal generation circuit is configured to, based on a first control signal including a first logic level and a second logic level, generate a second control signal including the first logic level and the second logic level. The communication interface is coupled to a communication bus. The communication interface is configured to receive an identifier setting command instructing to set an identifier of the communication device. The processing circuit is configured to set the identifier, based on the identifier setting command, when the first control signal is at the first logic level and the identifier has not yet been set based on the identifier setting command. The signal generation circuit is configured to: set the second control signal to the second logic level, when the processing circuit has not yet set the identifier, based on the identifier setting command; and set the second control signal to the first logic level, after the processing circuit sets the identifier, based on the identifier setting command.

A communication system according to one embodiment of the disclosure includes a communication bus, and multiple communication devices each coupled to the communication bus. Each of the multiple communication devices includes a signal generation circuit, a communication interface, and a processing circuit. The signal generation circuit is configured to, based on a first control signal including a first logic level and a second logic level, generate a second control signal including the first logic level and the second logic level. The communication interface is coupled to the communication bus. The communication interface is configured to receive an identifier setting command instructing to set an identifier of relevant one of the multiple communication devices. The processing circuit is configured to set the identifier, based on the identifier setting command, when the first control signal is at the first logic level and the identifier has not yet been set based on the identifier setting command. The signal generation circuit of each of the multiple communication devices is configured to: set the second control signal to the second logic level, when the processing circuit has not yet set the identifier, based on the identifier setting command; and set the second control signal to the first logic level, after the processing circuit sets the identifier, based on the identifier setting command. The signal generation circuit of each of one or more communication devices other than a predetermined communication device, among the multiple communication devices, is configured to supply the second control signal as the first control signal to the signal generation circuit of one of the multiple communication devices other than relevant one of the one or more communication devices.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

FIG. 17 is a timing diagram illustrating an operation example of the communication system illustrated in FIG. 15.

DETAILED DESCRIPTION

Figure 1:
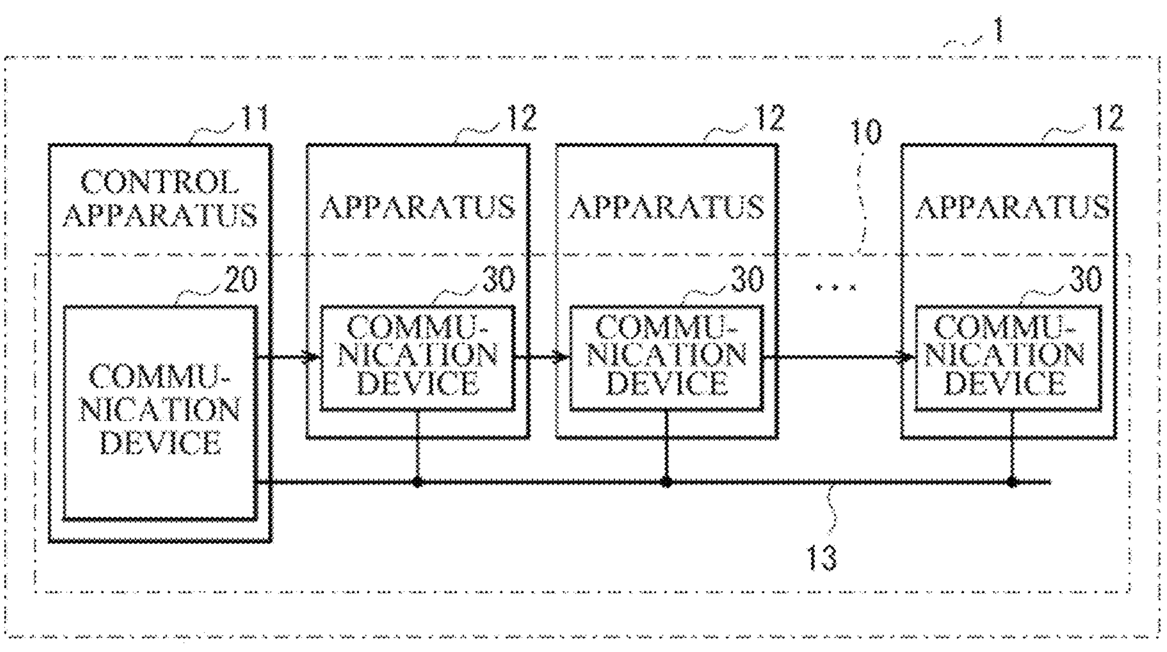
FIG. 1 is a block diagram illustrating a configuration example of an apparatus system including a communication system according to one example embodiment of the disclosure.

What is desired of a communication system is to set, in a simple way, respective identifiers of multiple communication devices each coupled to a communication bus.

It is desirable to provide a communication device and a communication system that each make it possible to set an identifier in a simple way.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings. Note that the description is given in the following order.

1. First Example Embodiment
2. Second Example Embodiment
3. Third Example Embodiment

1. First Example Embodiment

Configuration Example

FIG. 1 illustrates a configuration example of an apparatus system 1 including a communication system according to an example embodiment of the disclosure. The apparatus system 1 may include a control apparatus 11, multiple apparatuses 12, and a communication bus 13.

The control apparatus 11 may be configured to control an operation of the apparatus system 1. The control apparatus 11 may include a communication device 20. The communication device 20 may be configured to communicate with each of respective communication devices 30 (described later) of the multiple apparatuses 12 via the communication bus 13.

The multiple apparatuses 12 may each perform a predetermined operation. The multiple apparatuses 12 may each be any apparatus. In some embodiments, the multiple apparatuses 12 may operate in conjunction with each other. In some embodiments, the multiple apparatuses 12 may operate independently of each other. In some embodiments, the multiple apparatuses 12 may each be a switching power supply apparatus. The multiple apparatuses 12 may include the respective communication devices 30. The communication devices 30 may each be configured to communicate with the communication device 20 and with the other communication devices 30 via the communication bus 13.

The communication bus 13 may be configured to transfer data for exchange among the control apparatus 11 and the multiple apparatuses 12. In this example, the communication bus 13 may be a serial bus. The communication bus 13 may be in accordance with a communication standard such as RS-485. Note that the communication standard is not limited to RS-485 and may be any other communication standard. In some embodiments, the communication bus 13 may be a parallel bus.

The apparatus system 1 may include a communication system 10. The communication system 10 may include the communication device 20 of the control apparatus 11, the respective multiple communication devices 30 of the multiple apparatuses 12, and the communication bus 13.

Figure 2:
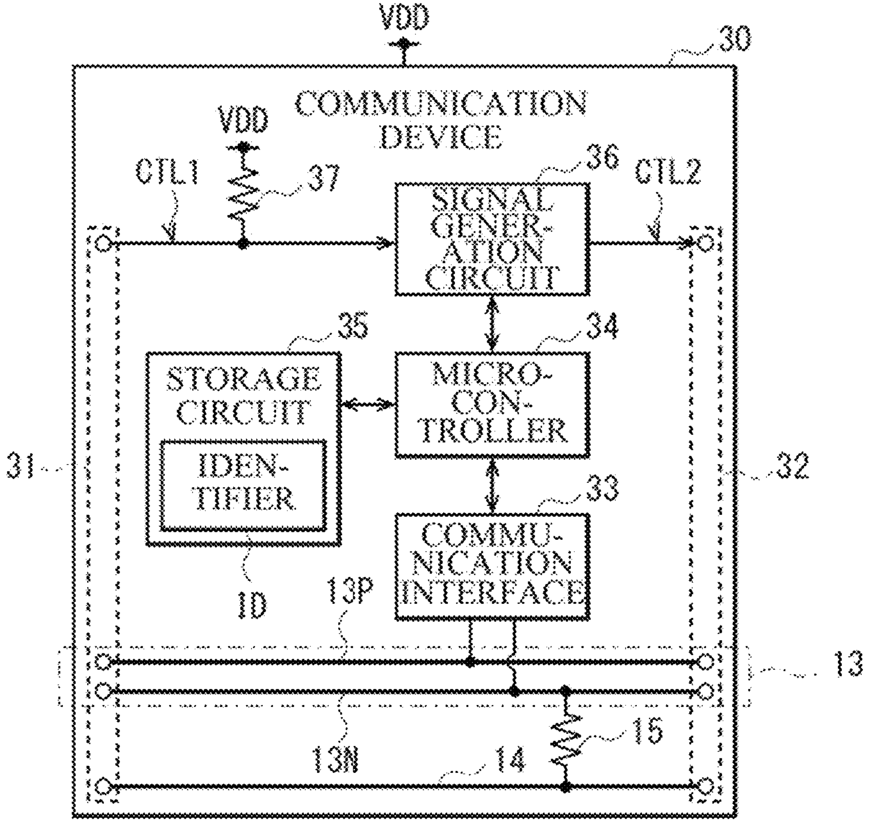
FIG. 2 is a circuit diagram illustrating a configuration example of a communication device according to one example embodiment of the disclosure.
Figure 3:
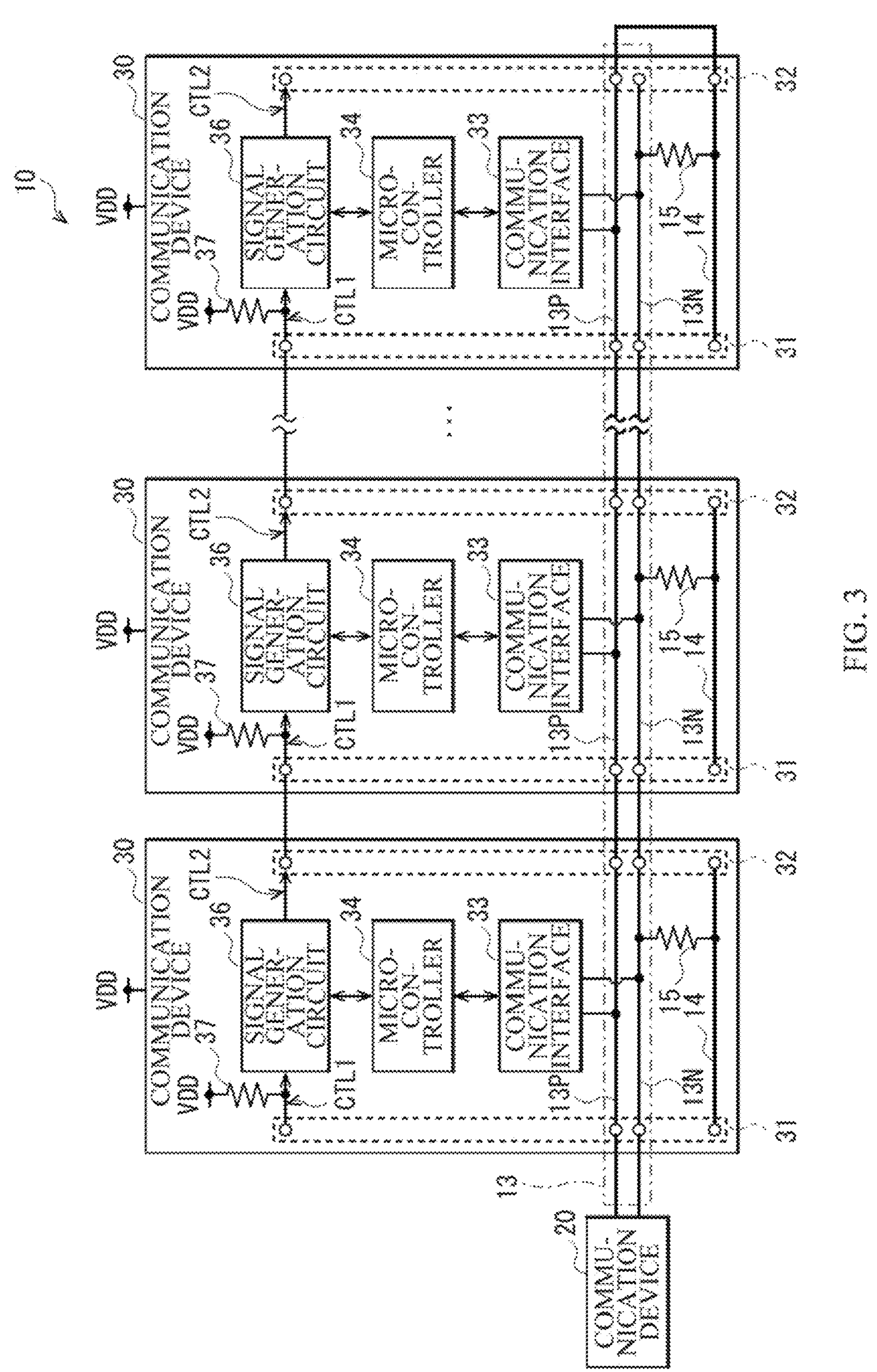
FIG. 3 is a circuit diagram illustrating a configuration example of a communication system including the communication device according to the example embodiment illustrated in FIG. 2.

FIG. 2 illustrates a configuration example of the communication device 30. FIG. 3 illustrates a configuration example of the communication system 10. In FIG. 3, some of components of the communication device 30 are not illustrated for convenience of description.

As illustrated in FIG. 2, the communication device 30 may include connectors 31 and 32, signal lines 13P and 13N, a signal line 14, a resistor 15, a communication interface 33, a microcontroller 34, a storage circuit 35, a signal generation circuit 36, and a resistor 37. For example, the communication device 30 may be supplied with a power supply voltage VDD generated inside the apparatus 12.

The connectors 31 and 32 may each be configured to couple the communication device 30 to any other device. The connectors 31 and 32 may each be provided with multiple terminals that each electrically couple the communication device 30 to any other device.

The signal lines 13P and 13N may be signal lines included in the communication bus 13. The signal line 13P may have a first end coupled to one of the terminals provided at the connector 31, and a second end coupled to one of the terminals provided at the connector 32. Similarly, the signal line 13N may have a first end coupled to one of the terminals provided at the connector 31, and a second end coupled to one of the terminals provided at the connector 32. The signal lines 13P and 13N may each have a predetermined characteristic impedance. As illustrated in FIG. 3, the respective signal lines 13P of the multiple communication devices 30 may be coupled to each other to form a single signal line, and the respective signal lines 13N of the multiple communication devices 30 may be coupled to each other to form a single signal line. In this example, the communication bus 13 may perform communication using a differential signal.

The signal line 14 may have a first end coupled to one of the terminals provided at the connector 31, and a second end coupled to one of the terminals provided at the connector 32.

The signal line 14 may have a predetermined characteristic impedance. The resistor 15 may have a first end coupled to the signal line 13N, and a second end coupled to the signal line 14. The resistor 15 may have a resistance value corresponding to the characteristic impedance of each of the signal lines 13P, 13N, and 14. As illustrated in FIG. 3, in the communication device 30 positioned most distant from the communication device 20 among the multiple communication devices 30, two of the terminals of the connector 32, a first one coupled to the signal line 13P and a second one coupled to the signal line 14, may be coupled to each other. This may cause the signal lines 13P and 13N to be coupled to each other via the resistor 15 of the communication device 30 positioned most distant from the communication device 20. This coupling may cause the resistor 15 to serve as a termination resistor of the communication bus 13. In some embodiments, the communication device 20 may similarly include a termination resistor of the communication bus 13. This termination resistor may have a first end coupled to the signal line 13P, and a second end coupled to the signal line 13N.

The communication interface 33 may be configured to communicate with the communication device 20 and with the other communication devices 30 via the communication bus 13. The communication interface 33 may be coupled to each of the signal lines 13P and 13N.

The microcontroller 34 may be configured to control an operation of the communication device 30. The microcontroller 34 may be configured to perform processing by a method such as executing a program held in the storage circuit 35. The microcontroller 34 may operate based on a command such as a command received by the communication interface 33. For example, at the time of shipment from a factory, the microcontroller 34 may set an identifier ID of the communication device 30, based on a control signal CTL1 supplied to the signal generation circuit 36, the identifier ID of the communication device 30, and a setting command received by the communication interface 33, as described later. In the present example embodiment, when the control signal CTL1 is at a high level and the identifier ID of the communication device 30 is at a predetermined initial value (of "1" in this example), the microcontroller 34 may set the identifier ID in a register, based on the setting command received by the communication interface 33, as described later. The multiple communication devices 30 may be set to respective identifiers ID different from each other. This allows the communication system 10 to identify the multiple communication devices 30 individually, enabling communication using the identifiers ID.

The storage circuit 35 may be a nonvolatile storage including a memory such as a flash memory. The storage circuit 35 may hold data such as a program to be executed by the microcontroller 34. The storage circuit 35 may further hold the identifier ID. After setting the identifier ID in the register, the microcontroller 34 may write the identifier ID in the storage circuit 35. Thereafter, when the communication device 30 is powered up, the microcontroller 34 may read the identifier ID held in the storage circuit 35 into the register. This allows the communication system 10 to perform communication using the identifiers ID after the communication devices 30 are powered up.

The signal generation circuit 36 is configured to generate a control signal CTL2, based on the control signal CTL1 and an instruction from the microcontroller 34. The signal generation circuit 36 may have an input terminal, for the control signal CTL1, coupled to one of the terminals provided at the connector 31, and an output terminal, for the control signal CTL2, coupled to one of the terminals provided at the connector 32.

The resistor 37 may be a pull-up resistor provided at the input terminal, for the control signal CTL1, of the signal generation circuit 36. The resistor 37 may have a first end to be supplied with the power supply voltage VDD, and a second end coupled to the input terminal, for the control signal CTL1, of the signal generation circuit 36.

As illustrated in FIG. 3, the multiple communication devices 30 may be daisy-chained. In FIG. 3, a leftmost one of the communication devices 30 may be the communication device 30 positioned in a first stage, and a rightmost one of the communication devices 30 may be the communication device 30 positioned in a last stage. The signal generation circuit 36 of each of the multiple communication devices 30 other than the communication device 30 positioned in the last stage may supply the generated control signal CTL2 as the control signal CTL1 to the signal generation circuit 36 of the communication device 30 positioned in the next stage. In the signal generation circuit 36 of the communication device 30 positioned in the first stage, the input terminal for the control signal CTL1 may be uncoupled to the other communication devices 30. Accordingly, this input terminal for the control signal CTL1 may be set to the high level by the resistor 37. Further, in the signal generation circuit 36 of the communication device 30 positioned in the last stage, the output terminal for the control signal CTL2 may be uncoupled to the other communication devices 30.

Here, the signal generation circuit 36 may correspond to a specific but non-limiting example of a "signal generation circuit" in one embodiment of the disclosure. The communication interface 33 may correspond to a specific but non-limiting example of a "communication interface" in one embodiment of the disclosure. The communication bus 13 may correspond to a specific but non-limiting example of a "communication bus" in one embodiment of the disclosure. The microcontroller 34 may correspond to a specific but non-limiting example of a "processing circuit" in one embodiment of the disclosure. The control signal CTL1 may correspond to a specific but non-limiting example of a "first control signal" in one embodiment of the disclosure. The control signal CTL2 may correspond to a specific but non-limiting example of a "second control signal" in one embodiment of the disclosure. The communication device 20 may correspond to a specific but non-limiting example of a "control communication device" in one embodiment of the disclosure.

Example Operation and Example Workings

A description will now be given of an example operation and example workings of the communication system 10 according to the present example embodiment.

Outline of Overall Operation

A description will first be given of an outline of an overall operation of the communication system 10 with reference to FIGS. 2 and 3.

The communication device 20 may communicate with each of the multiple communication devices 30 via the communication bus 13. The communication interface 33 of each of the communication devices 30 may communicate with the communication device 20 and with the other communication devices 30 via the communication bus 13. The signal generation circuit 36 may generate the control signal CTL2, based on the control signal CTL1 supplied via the corresponding one of the terminals provided at the connector 31 and the instruction from the microcontroller 34. The microcontroller 34 may control the operation of the communication device 30.

For example, at the time of shipment from a factory, the microcontroller 34 may set the identifier ID of the communication device 30, based on the control signal CTL1 supplied to the signal generation circuit 36, the identifier ID of the communication device 30, and the setting command received by the communication interface 33. In the present example embodiment, when the control signal CTL1 is at the high level and the identifier ID of the communication device 30 is at the predetermined initial value (of "1" in this example), the microcontroller 34 may set the identifier ID in the register, based on the setting command received by the communication interface 33. Thereafter, the microcontroller 34 may write the identifier ID in the storage circuit 35.

Detailed Operation

In the following, a description will be given in detail of an operation of setting the respective identifiers ID of the multiple communication devices 30. In the following description, the communication system 10 may include eight communication devices 30 (communication devices 30A to 30H). The communication devices 30A to 30H may be daisy-chained in this order.

Figure 4:
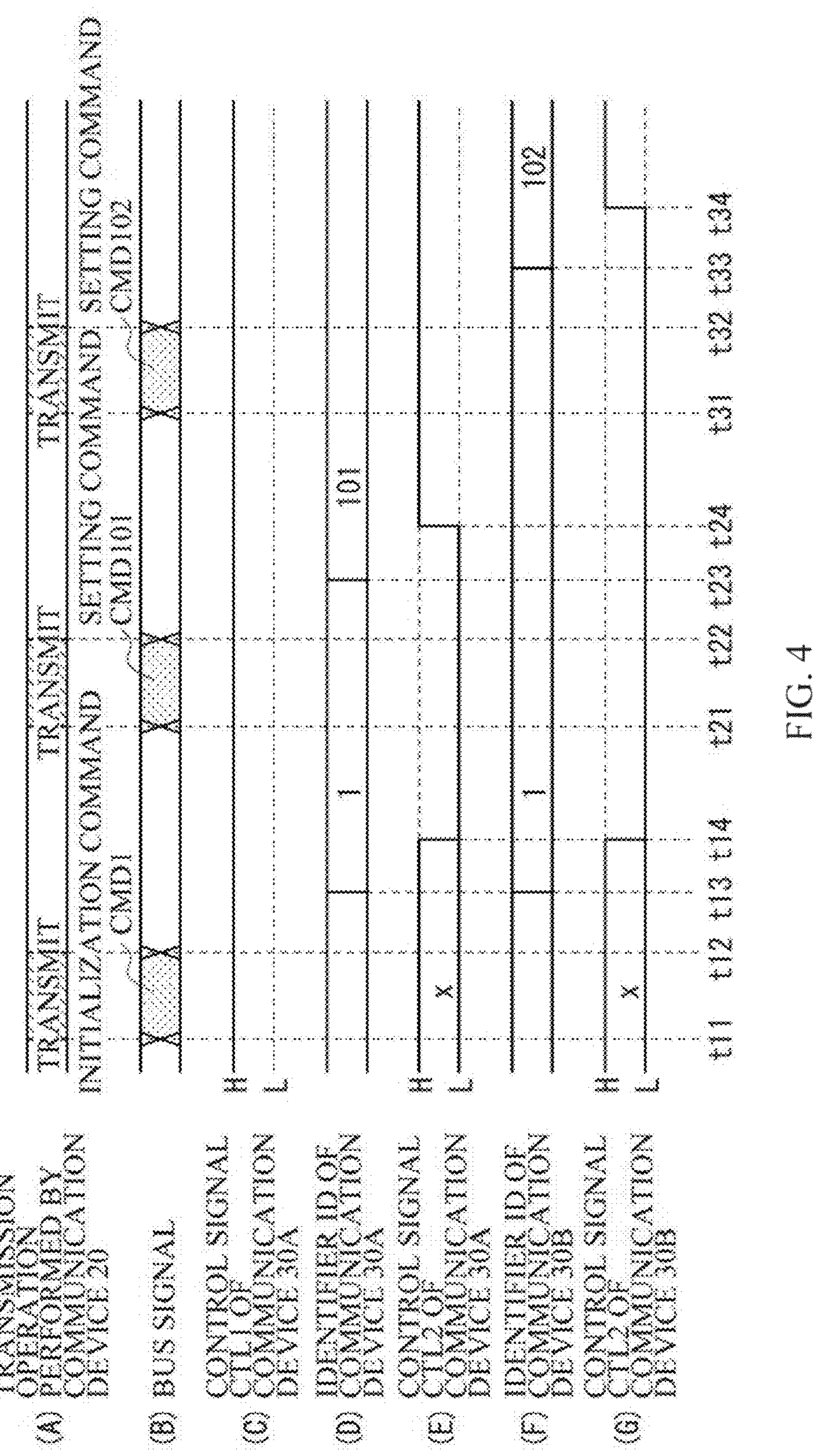
FIG. 4 is a timing diagram illustrating an operation example of the communication system illustrated in FIG. 3.

FIG. 4 illustrates an example of an operation of setting the identifiers ID in the communication system 10. In FIG. 4, part (A) illustrates a transmission operation performed by the communication device 20, part (B) illustrates a bus signal of the communication bus 13, part (C) illustrates a waveform of the control signal CTL1 of the communication device 30A, part (D) illustrates the identifier ID of the communication device 30A, part (E) illustrates a waveform of the control signal CTL2 of the communication device 30A, part (F) illustrates the identifier ID of the communication device 30B, and part (G) illustrates a waveform of the control signal CTL2 of the communication device 30B. In parts (E) and (G) in FIG. 4, a symbol "x" indicates that the control signal CTL2 may be set to either a low level (an "L" level) or the high level (an "H" level). FIGS. 5A to 5D each illustrate respective operation states of the multiple communication devices 30.

First, as illustrated in FIG. 4, in a time period from a timing t11 to a timing t12, the communication device 20 may transmit an initialization command CMD1 via the communication bus 13 (parts (A) and (B) in FIG. 4). The initialization command CMD1 may instruct to initialize the identifier ID. The communication interface 33 of each of the communication devices 30A to 30H may receive the initialization command CMD1.

Thereafter, at a timing t13, the microcontroller 34 of each of the communication devices 30A to 30H may set the identifier ID to the predetermined initial value (of "1" in this example), based on the initialization command CMD1 (parts (D) and (F) in FIG. 4). For example, the microcontroller 34 of the communication device 30A may set the identifier ID of the communication device 30A to the initial value (part (D) in FIG. 4), and the microcontroller 34 of the communication device 30B may set the identifier ID of the communication device 30B to the initial value (part (F) in FIG. 4). The communication devices 30C to 30H may each perform similar setting.

Thereafter, at a timing t14, the signal generation circuit 36 of each of the communication devices 30A to 30H may set the control signal CTL2 to the low level (parts (E) and (G) in FIG. 4). In this example, upon setting the identifier ID to the initial value, the microcontroller 34 may instruct the signal generation circuit 36 to set the control signal CTL2 to the low level, and the signal generation circuit 36 may set the control signal CTL2 to the low level, based on the instruction from the microcontroller 34. For example, the signal generation circuit 36 of the communication device 30A may set the control signal CTL2 of the communication device 30A to the low level (part (E) in FIG. 4), and the signal generation circuit 36 of the communication device 30B may set the control signal CTL2 of the communication device 30B to the low level (part (G) in FIG. 4). The communication devices 30C to 30H may each perform similar setting.

Figure 5A:
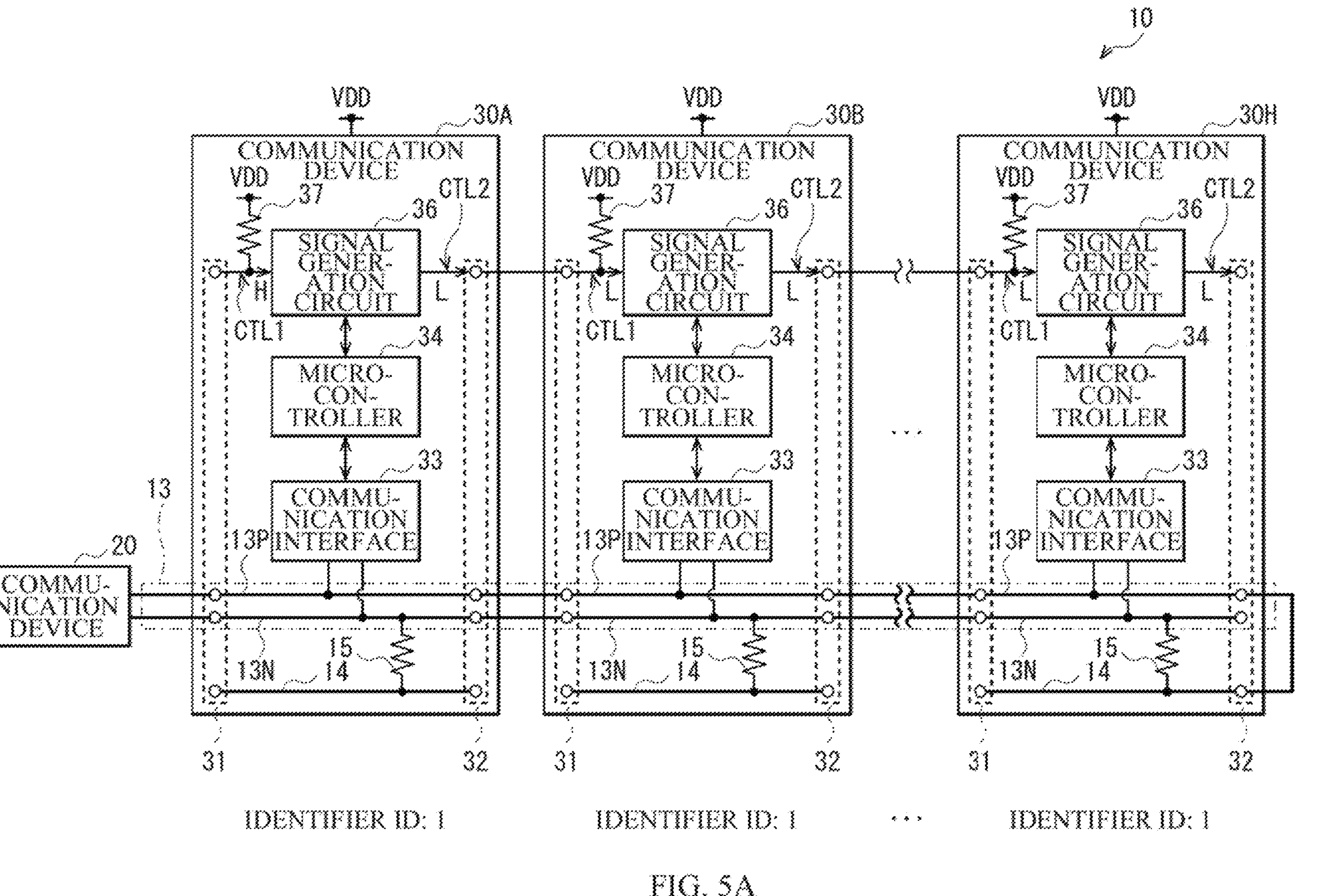
FIG. 5A is an explanatory diagram illustrating an operation state of the communication system illustrated in FIG. 3.

In this way, as illustrated in FIG. 5A, the respective eight identifiers ID of the communication devices 30A to 30H of the communication system 10 may each be set to the initial value (of "1" in this example). Further, the respective eight control signals CTL2 of the communication devices 30A to 30H may each be set to the low level. This may cause the respective control signals CTL1 of the communication devices 30B to 30H to each be at the low level. The control signal CTL1 of the communication device 30A may be at the high level.

Thereafter, as illustrated in FIG. 4, in a time period from a timing t21 to a timing t22, the communication device 20 may transmit a setting command CMD101 via the communication bus 13 (parts (A) and (B) in FIG. 4). The setting command CMD101 may instruct to set the identifier ID to "101". The communication interface 33 of each of the communication devices 30A to 30H may receive the setting command CMD101.

Thereafter, at a timing t23, the microcontroller 34 of the communication device 30A may set the identifier ID of the communication device 30A to "101", based on the control signal CTL1 of the communication device 30A (part (C) in FIG. 4), the identifier ID of the communication device 30A (part (D) in FIG. 4), and the setting command CMD101. In this example, the control signal CTL1 of the communication device 30A may be at the high level, and the identifier ID of the communication device 30A immediately before the timing t23 may be at the initial value (of "1"). Accordingly, the microcontroller 34 of the communication device 30A may set the identifier ID of the communication device 30A to "101", based on the setting command CMD101.

Thereafter, at a timing t24, the signal generation circuit 36 of the communication device 30A may set the control signal CTL2 to the high level (part (E) in FIG. 4). In this example, upon setting the identifier ID of the communication device 30A, the microcontroller 34 of the communication device 30A may instruct the signal generation circuit 36 to set the control signal CTL2 to the high level, and the signal generation circuit 36 may set the control signal CTL2 to the high level, based on the instruction from the microcontroller 34.

Figure 5B:
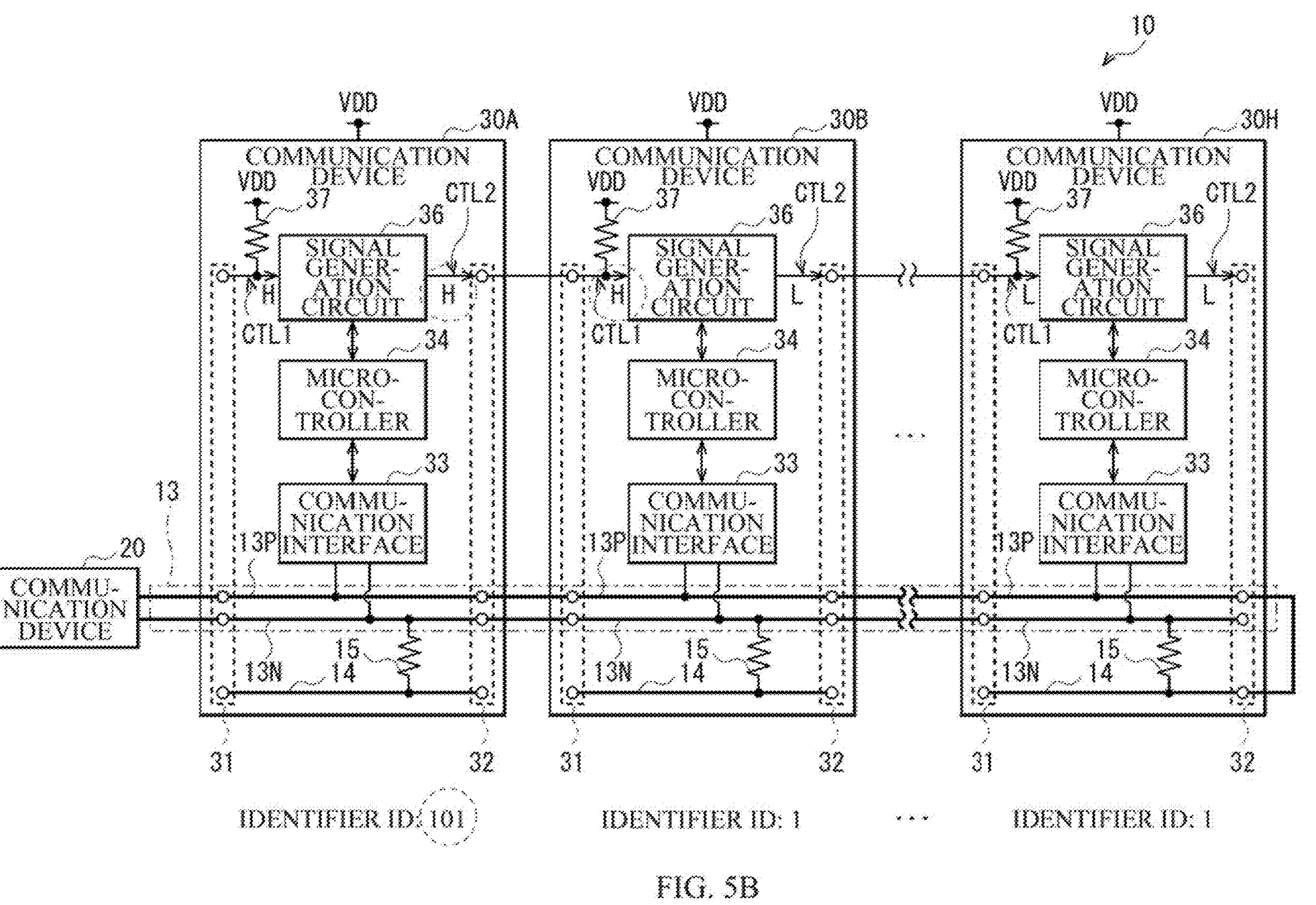
FIG. 5B is an explanatory diagram illustrating another operation state of the communication system illustrated in FIG. 3.

In this way, as illustrated in FIG. 5B, the identifier ID of the communication device 30A of the communication system 10 may be set to "101" corresponding to the setting command CMD101. Further, the control signal CTL2 of the communication device 30A may be set to the high level. This may cause the control signal CTL1 of the communication device 30B positioned in the next stage of the communication device 30A to be at the high level. The identifier ID of the communication device 30B may remain at the initial value (of "1").

Thereafter, as illustrated in FIG. 4, in a time period from a timing t31 to a timing t32, the communication device 20 may transmit a setting command CMD102 via the communication bus 13 (parts (A) and (B) in FIG. 4). The setting command CMD102 may instruct to set the identifier ID to "102". The communication interface 33 of each of the communication devices 30A to 30H may receive the setting command CMD102.

Thereafter, at a timing t33, the microcontroller 34 of the communication device 30B may set the identifier ID of the communication device 30B to "102", based on the control signal CTL1 of the communication device 30B, the identifier ID of the communication device 30B, and the setting command CMD102 (part (F) in FIG. 4). In this example, the control signal CTL1 of the communication device 30B may be at the high level because being the same as the control signal CTL2 of the communication device 30A (part (E) in FIG. 4), and the identifier ID of the communication device 30B immediately before the timing t33 may be at the initial value (of "1"). Accordingly, the microcontroller 34 of the communication device 30B may set the identifier ID of the communication device 30B to "102", based on the setting command CMD102.

Thereafter, at a timing t34, the signal generation circuit 36 of the communication device 30B may set the control signal CTL2 to the high level (part (G) in FIG. 4). In this example, upon setting the identifier ID of the communication device 30B, the microcontroller 34 of the communication device 30B may instruct the signal generation circuit 36 to set the control signal CTL2 to the high level, and the signal generation circuit 36 may set the control signal CTL2 to the high level, based on the instruction from the microcontroller 34.

Figure 5C:
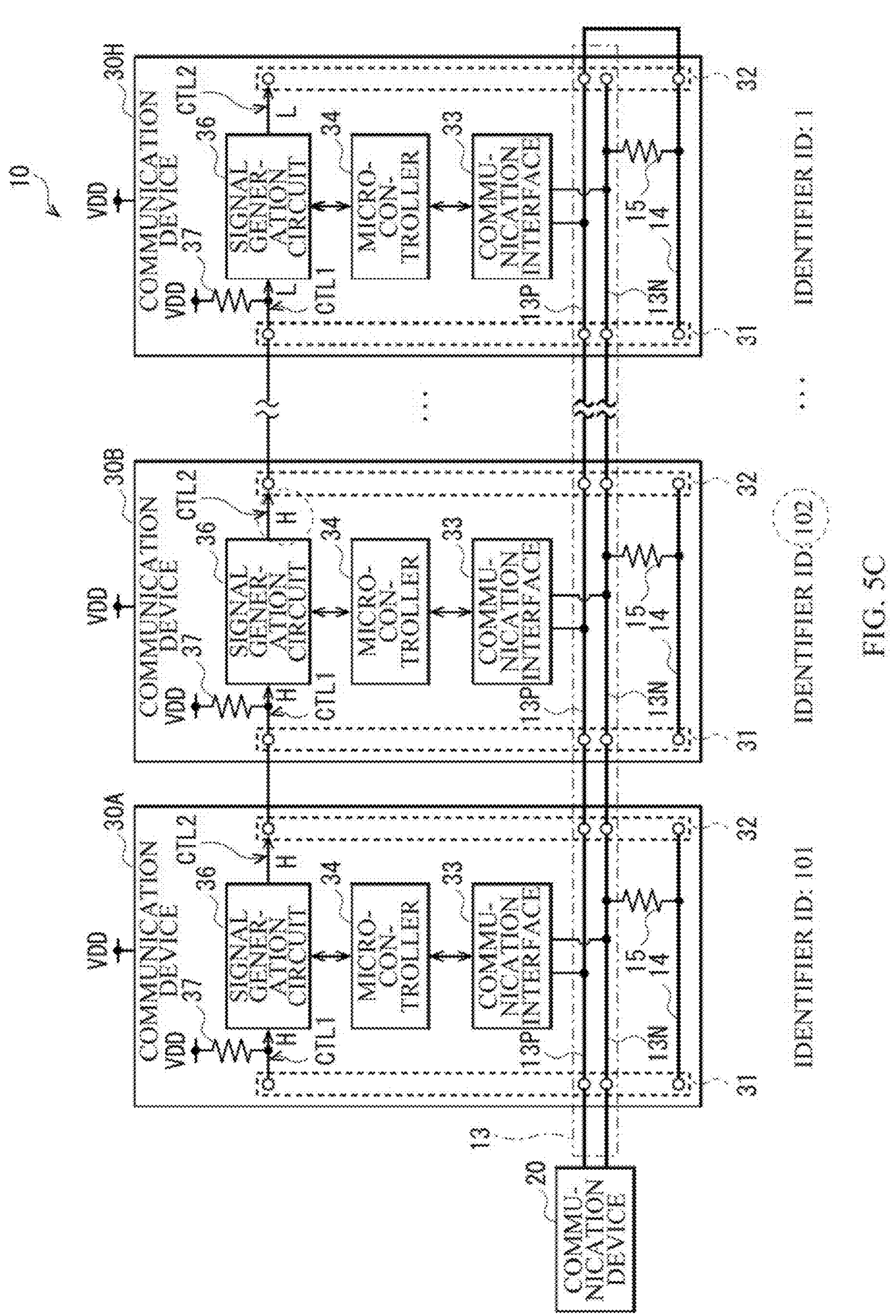
FIG. 5C is an explanatory diagram illustrating still another operation state of the communication system illustrated in FIG. 3.

In this way, as illustrated in FIG. 5C, the identifier ID of the communication device 30B of the communication system 10 may be set to "102" corresponding to the setting command CMD102. Further, the control signal CTL2 of the communication device 30B may be set to the high level. This may cause the control signal CTL1 of the communication device 30C positioned in the next stage of the communication device 30B to be at the high level. The identifier ID of the communication device 30C may remain at the initial value (of "1").

Figure 5D:
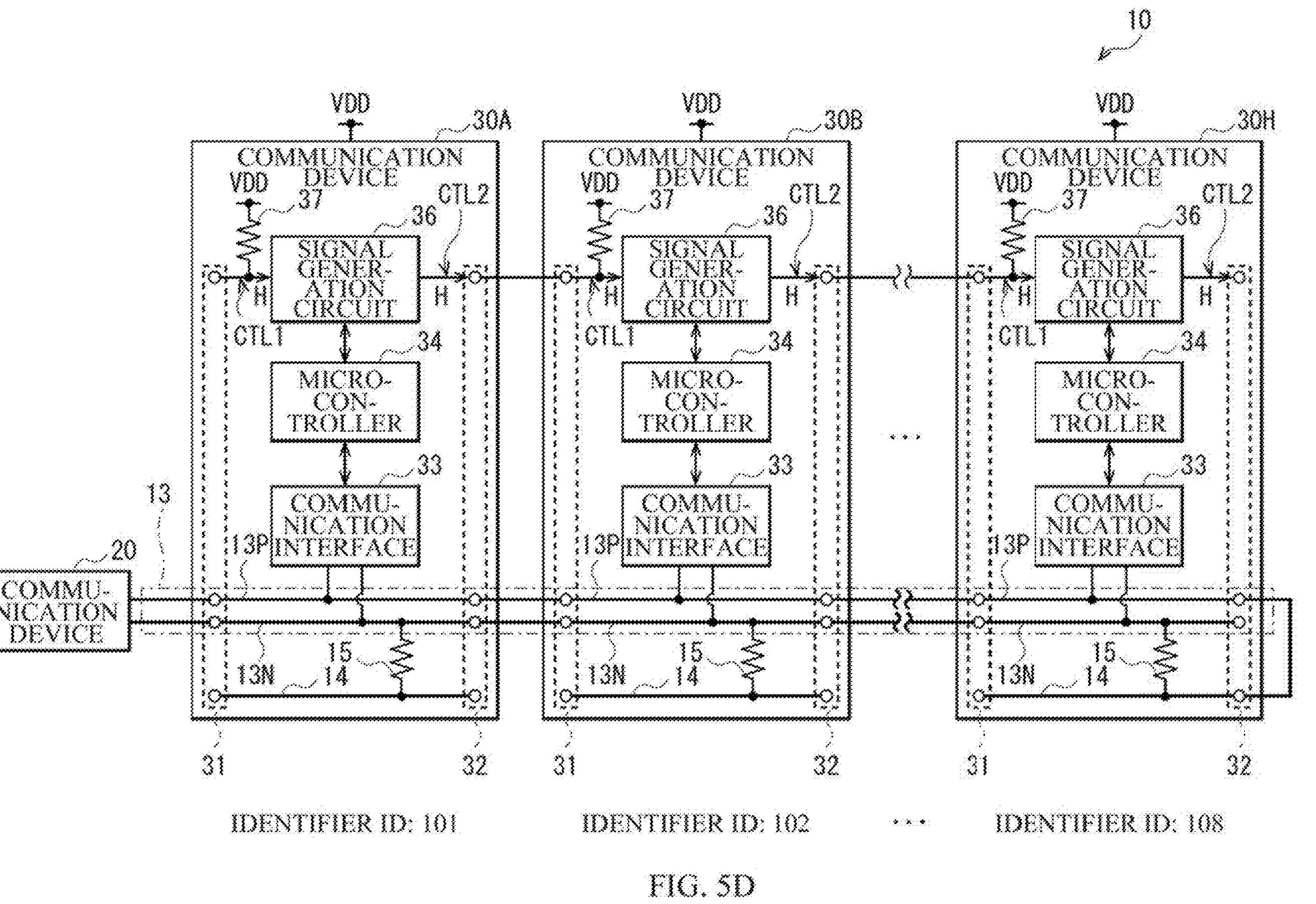
FIG. 5D is an explanatory diagram illustrating yet another operation state of the communication system illustrated in FIG. 3.

The communication system 10 may repeat the operation described above. As a result, the respective identifiers ID of the communication devices 30A to 30H of the communication system 10 may be set to "101" to "108", as illustrated in FIG. 5D. Thereafter, the microcontroller 34 of each of the communication devices 30A to 30H may write the identifier ID of relevant one of the communication devices 30A to 30H in the storage circuit 35.

As described above, the communication device 30 includes the signal generation circuit 36, the communication interface 33, and the processing circuit (the microcontroller 34). The signal generation circuit 36 is configured to, based on a first control signal (the control signal CTL1) including a first logic level (the high level) and a second logic level (the low level), generate a second control signal (the control signal CTL2) including the first logic level (the high level) and the second logic level (the low level). The communication interface 33 is coupled to the communication bus 13. The communication interface 33 is configured to receive an identifier setting command (e.g., the setting command CMD102) instructing to set the identifier ID of the communication device 30. The processing circuit (the microcontroller 34) is configured to set the identifier ID, based on the identifier setting command, when the first control signal (the control signal CTL1) is at the first logic level (the high level) and the identifier ID has not yet been set based on the identifier setting command. The signal generation circuit 36 is configured to: set the second control signal (the control signal CTL2) to the second logic level (the low level), when the processing circuit (the microcontroller 34) has not yet set the identifier ID, based on the identifier setting command; and set the second control signal (the control signal CTL2) to the first logic level (the high level), after the processing circuit (the microcontroller 34) sets the identifier ID, based on the identifier setting command. Such a configuration helps to allow, for example, the communication device 30B to set the identifier ID of the communication device 30B to "102", based on the setting command CMD102 received by the communication interface 33, when the control signal CTL1 is at the high level and the identifier ID of the communication device 30B is at the initial value (of "1" in this example), as illustrated in FIGS. 4, 5B, and 5C. At this time, because the identifier ID of the communication device 30A is not at the initial value, the communication device 30A may not set the identifier ID, based on the setting command CMD102. Further, because the control signal CTL1 of each of the communication devices 30C to 30H is at the low level, the communication devices 30C to 30H may not each set the identifier ID, based on the setting command CMD102. Such a configuration helps to selectively set the identifier ID of the communication device 30B among the communication devices 30A to 30H, based on the setting command CMD102. The configuration helps to allow the communication devices 30 to set the respective identifiers ID in a simple way.

For example, in a communication system including multiple communication devices, the multiple communication devices can each be provided with a physical switch such as a DIP switch to thereby set respective identifiers ID of the multiple communication devices using the physical switches. In such a case, setting the respective identifiers ID takes time and effort. Further, for example, in a communication system including multiple communication devices, respective identifiers ID of the multiple communication devices can be sequentially set through communication via a communication bus. Such a communication system, however, involves attachment and detachment of the communication devices to cause one of the communication devices to be coupled to the communication bus, which takes time and effort. Furthermore, for example, a technique disclosed in JP-A No. 2019-46104 can involve a complex system configuration because it is necessary to provide a selection circuit that sequentially selects multiple communication devices each coupled to a communication bus and wiring between the selection circuit and each of the multiple communication devices.

In contrast, the communication devices 30 may each be provided with the signal generation circuit 36, and the respective signal generation circuits 36 of the multiple communication devices 30 may be daisy-chained. Such a configuration helps to sequentially set the respective identifiers ID of the multiple communication devices 30 through communication via the communication bus, allowing for a reduction in time and effort. This configuration of the communication devices 30 further helps to achieve a simple system configuration.

Further, the processing circuit (the microcontroller 34) of the communication device 30 may determine whether the identifier ID has been set based on the identifier setting command, by checking whether the identifier ID is at the predetermined initial value (of "1" in this example). For example, if the identifier ID is at the initial value (of "1"), the microcontroller 34 may determine that the identifier ID has not yet been set. If the identifier ID is not at the initial value (of "1"), the microcontroller 34 may determine that the identifier ID has already been set. Such a configuration helps to allow the microcontroller 34 to determine, in a simple way, whether the identifier ID has been set based on the identifier setting command. After the microcontroller 34 sets the identifier ID, the signal generation circuit 36 may set the control signal CTL2 to the high level, based on the determination made by the microcontroller 34, which allows the communication device 30 positioned in the next stage to set the identifier ID. This helps to allow the communication devices 30 to set the respective identifiers ID in a simple way.

Example Effects

As described above, according to the present example embodiment, the communication device includes the signal generation circuit, the communication interface, and the processing circuit. The signal generation circuit is configured to, based on the first control signal including the first logic level and the second logic level, generate the second control signal including the first logic level and the second logic level. The communication interface is coupled to the communication bus. The communication interface is configured to receive the identifier setting command instructing to set the identifier of the communication device. The processing circuit is configured to set the identifier, based on the identifier setting command, when the first control signal is at the first logic level and the identifier has not yet been set based on the identifier setting command. The signal generation circuit is configured to: set the second control signal to the second logic level, when the processing circuit has not yet set the identifier, based on the identifier setting command; and set the second control signal to the first logic level, after the processing circuit sets the identifier, based on the identifier setting command. Such a configuration helps to set the identifier in a simple way.

In the present example embodiment, the processing circuit may determine whether the identifier has been set based on the identifier setting command, by checking whether the identifier is at the predetermined initial value. Such a configuration helps to make determination in a simple way as to whether the identifier has been set based on the identifier setting command.

Modification Example 1-1

Figure 6:
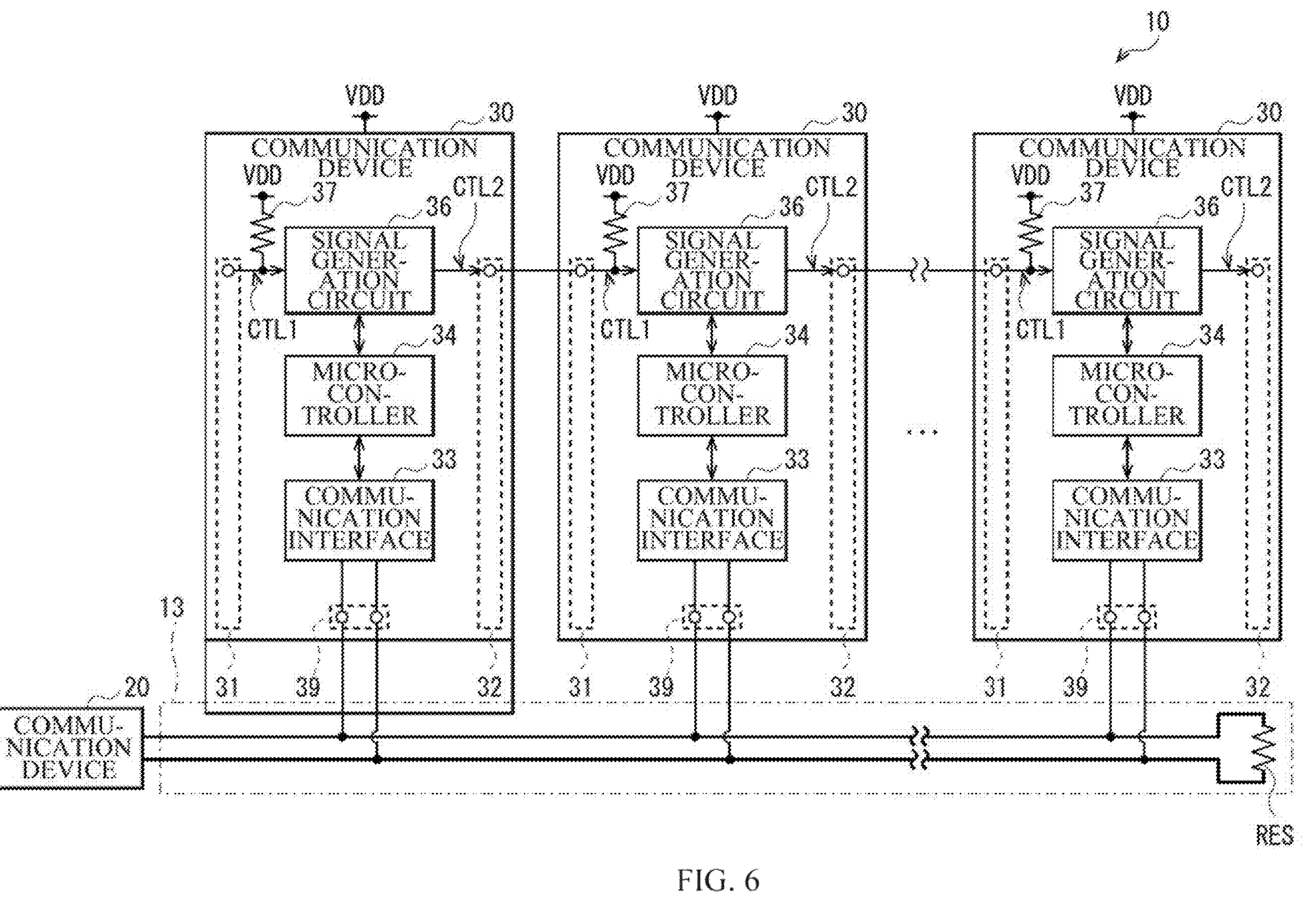
FIG. 6 is a circuit diagram illustrating a configuration example of a communication system according to a modification example of the example embodiment illustrated in FIG. 3.
Figure 7:
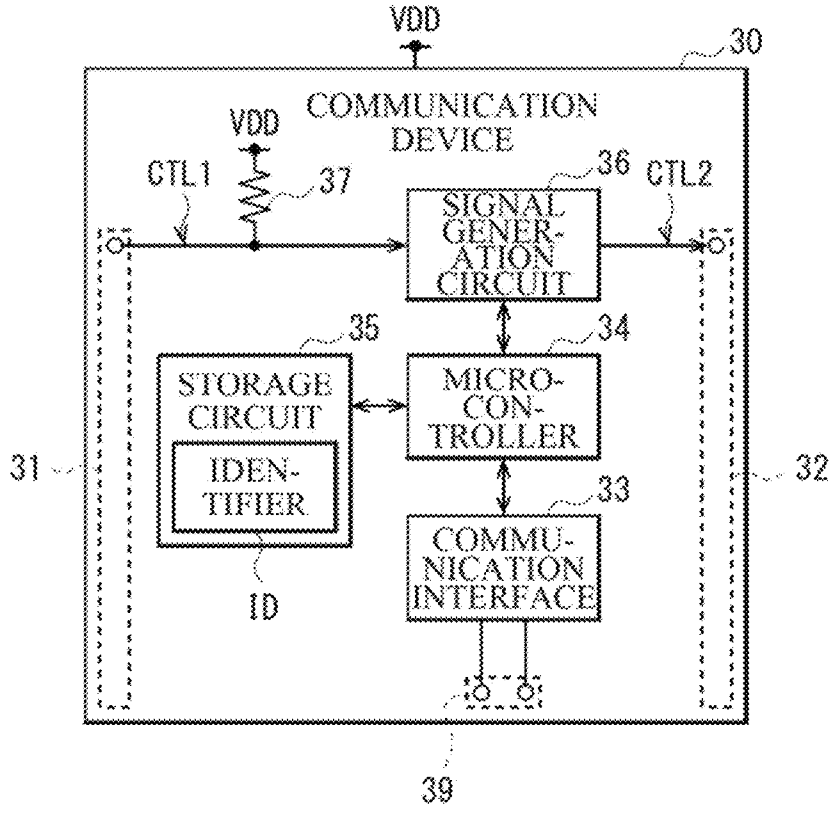
FIG. 7 is a circuit diagram illustrating a configuration example of a communication device illustrated in FIG. 6.

In the foregoing example embodiment, as illustrated in FIG. 3, the communication bus 13 may include the respective signal lines 13P and 13N provided in the multiple communication devices 30; however, this is non-limiting. In some embodiments, as illustrated in FIGS. 6 and 7, the communication bus 13 may be provided outside the multiple communication devices 30. The communication device 30 according to the present modification example may include a connector 39. The communication interface 33 may be coupled to the communication bus 13 via the connector 39. As illustrated in FIG. 6, the communication bus 13 may include a resistor RES serving as a termination resistor.

Modification Example 1-2

In the foregoing example embodiment, the determination as to whether the identifier ID has been set may be made by checking whether the identifier ID is at the predetermined initial value (of "1" in this example); however, this is non-limiting. In some embodiments, a flag such as a setting flag F indicating whether the identifier ID has been set may be used. In the following, a description will be given in detail of the present modification example.

Figure 8:
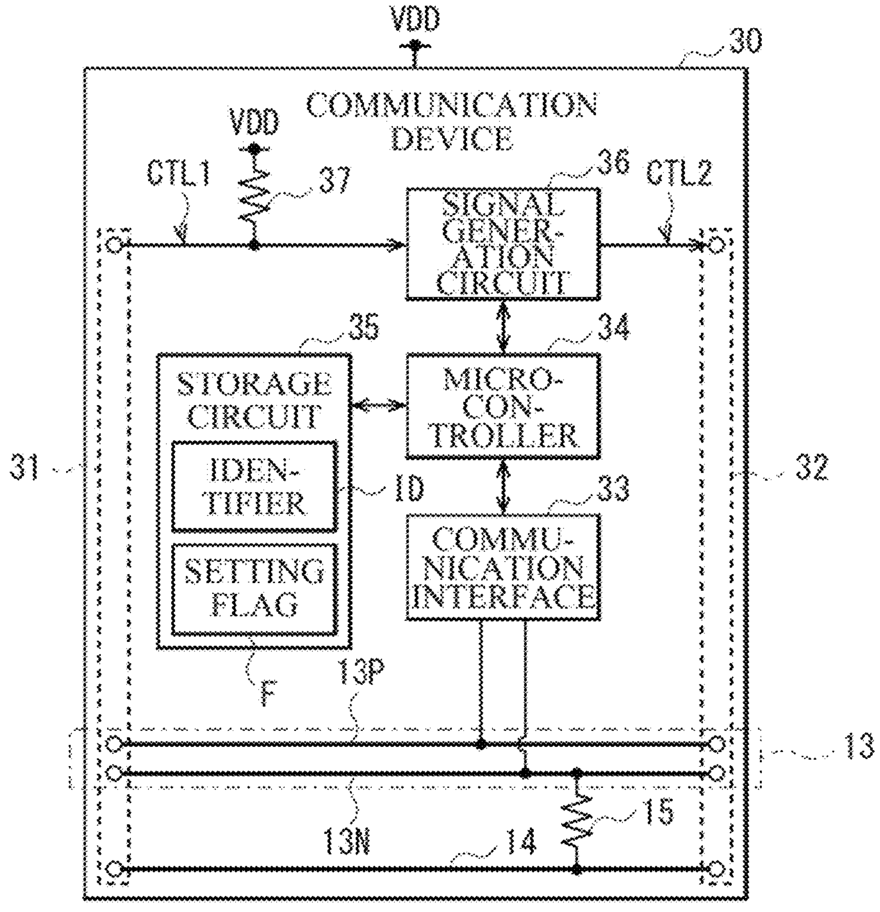
FIG. 8 is a circuit diagram illustrating a configuration example of a communication device according to another modification example of the example embodiment illustrated in FIGS. 2 and 3.

FIG. 8 illustrates a configuration example of the communication device 30 according to the present modification example. The storage circuit 35 of the communication device 30 according to the present modification example may hold the identifier ID and the setting flag F. In this example, the setting flag F may be set to "0" when the identifier ID has not yet been set, and may be set to "1" when the identifier ID has been already set. After setting the identifier ID and the setting flag F in the register, the microcontroller 34 may write the identifier ID and the setting flag F in the storage circuit 35. Thereafter, when the communication device 30 is powered up, the microcontroller 34 may read the identifier ID and the setting flag F held in the storage circuit 35 into the register.

For example, at the time of shipment from a factory, the microcontroller 34 may set the identifier ID of the communication device 30, based on the control signal CTL1 supplied to the signal generation circuit 36, the setting flag F of the communication device 30, and the setting command received by the communication interface 33. In this example, when the control signal CTL1 is at the high level and the setting flag F of the communication device 30 is at "0", the microcontroller 34 may set the identifier ID in the register, based on the setting command received by the communication interface 33. Thereafter, the microcontroller 34 may set the setting flag F to "1".

Figure 9:
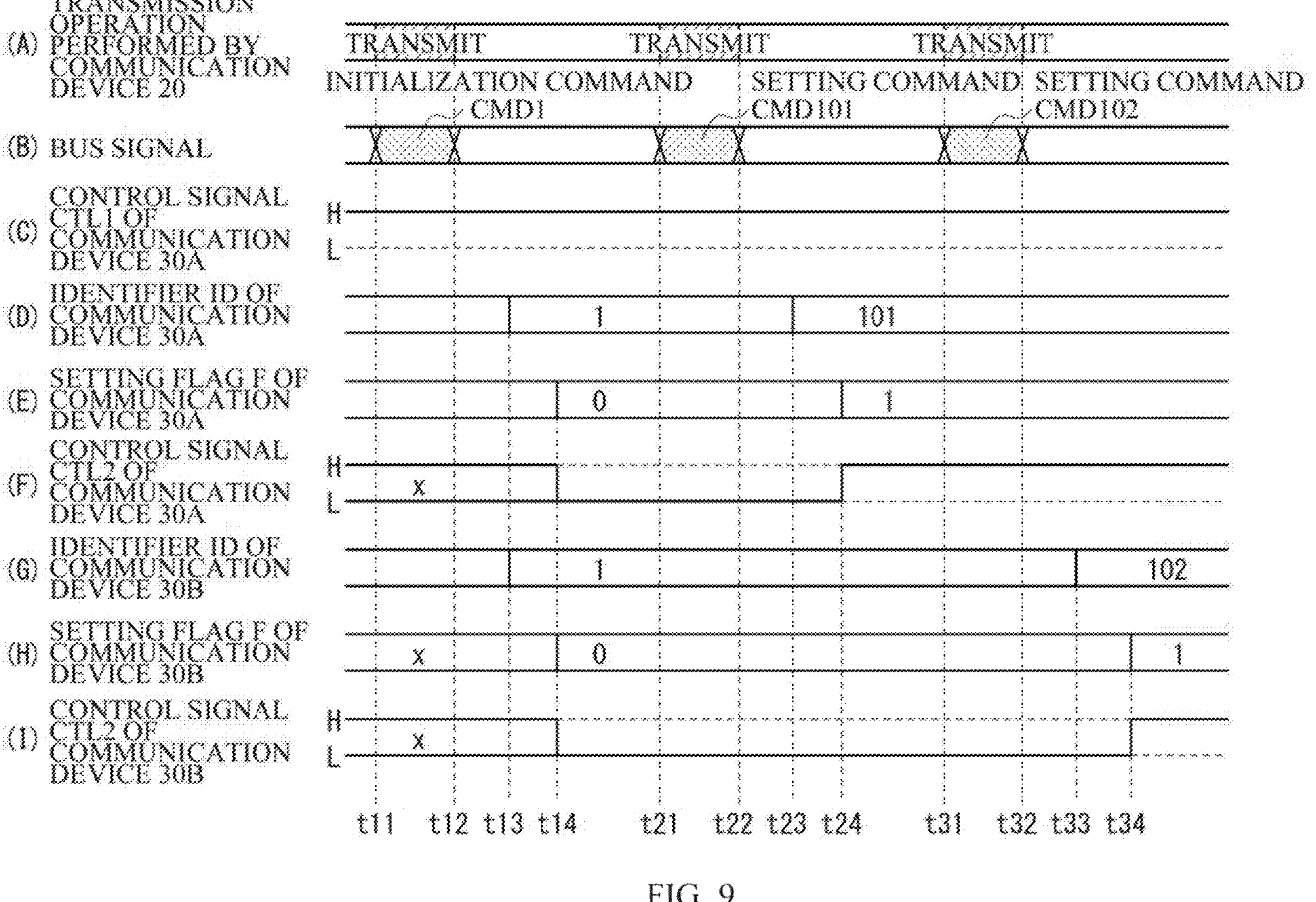
FIG. 9 is a timing diagram illustrating an operation example of a communication system including the communication device illustrated in FIG. 8.

FIG. 9 illustrates an example of an operation of setting the identifiers ID in the communication system 10 according to the present modification example. In FIG. 9, part (A) illustrates a transmission operation performed by the communication device 20, part (B) illustrates a bus signal of the communication bus 13, part (C) illustrates a waveform of the control signal CTL1 of the communication device 30A, part (D) illustrates the identifier ID of the communication device 30A, part (E) illustrates the setting flag F of the communication device 30A, part (F) illustrates a waveform of the control signal CTL2 of the communication device 30A, part (G) illustrates the identifier ID of the communication device 30B, part (H) illustrates the setting flag F of the communication device 30B, and part (I) illustrates a waveform of the control signal CTL2 of the communication device 30B.

First, as illustrated in FIG. 9, in the time period from the timing t11 to the timing t12, the communication device 20 may transmit the initialization command CMD1 via the communication bus 13 (parts (A) and (B) in FIG. 9). The communication interface 33 of each of the communication devices 30A to 30H may receive the initialization command CMD1. Thereafter, at the timing t13, the microcontroller 34 of each of the communication devices 30A to 30H may set the identifier ID to the predetermined initial value (of "1" in this example), based on the initialization command CMD1 (parts (D) and (G) in FIG. 9).

Thereafter, at the timing t14, the microcontroller 34 of each of the communication devices 30A to 30H may set the setting flag F to "0" (parts (E) and (H) in FIG. 9). For example, the microcontroller 34 of the communication device 30A may set the setting flag F of the communication device 30A to "0" (part (E) in FIG. 9), and the microcontroller 34 of the communication device 30B may set the setting flag F of the communication device 30B to "0" (part (H) in FIG. 9). The communication devices 30C to 30H may each perform similar setting.

Further, at the timing t14, the signal generation circuit 36 of each of the communication devices 30A to 30H may set the control signal CTL2 to the low level (parts (F) and (I) in FIG. 9).

In this way, as illustrated in FIG. 5A, the respective eight identifiers ID of the communication devices 30A to 30H of the communication system 10 may each be set to the initial value (of "1" in this example). Further, the respective eight control signals CTL2 of the communication devices 30A to 30H may each be set to the low level. This may cause the respective control signals CTL1 of the communication devices 30B to 30H to each be at the low level. The control signal CTL1 of the communication device 30A may be at the high level.

Thereafter, as illustrated in FIG. 9, in the time period from the timing t21 to the timing t22, the communication device 20 may transmit the setting command CMD101 via the communication bus 13 (parts (A) and (B) in FIG. 9). The communication interface 33 of each of the communication devices 30A to 30H may receive the setting command CMD101.

Thereafter, at the timing t23, the microcontroller 34 of the communication device 30A may set the identifier ID of the communication device 30A to "101", based on the control signal CTL1 of the communication device 30A (part (C) in FIG. 9), the setting flag F of the communication device 30A (part (E) in FIG. 9), and the setting command CMD101 (part (D) in FIG. 9). In this example, the control signal CTL1 of the communication device 30A may be at the high level, and the setting flag F of the communication device 30A may be at "0". Accordingly, the microcontroller 34 of the communication device 30A may set the identifier ID of the communication device 30A to "101", based on the setting command CMD101.

Thereafter, at the timing t24, the microcontroller 34 of the communication device 30A may set the setting flag F to "1" (part (E) in FIG. 9). In this example, upon setting the identifier ID of the communication device 30A, the microcontroller 34 of the communication device 30A may set the setting flag F of the communication device 30A to "1".

Further, at the timing t24, the signal generation circuit 36 of the communication device 30A may set the control signal CTL2 to the high level (part (F) in FIG. 9).

In this way, as illustrated in FIG. 5B, the identifier ID of the communication device 30A of the communication system 10 may be set to "101" corresponding to the setting command CMD101. Further, the control signal CTL2 of the communication device 30A may be set to the high level. This may cause the control signal CTL1 of the communication device 30B positioned in the next stage of the communication device 30A to be at the high level. The identifier ID of the communication device 30B may remain at the initial value (of "1").

Thereafter, as illustrated in FIG. 9, in the time period from the timing t31 to the timing t32, the communication device 20 may transmit the setting command CMD102 via the communication bus 13 (parts (A) and (B) in FIG. 9). The communication interface 33 of each of the communication devices 30A to 30H may receive the setting command CMD102.

Thereafter, at the timing t33, the microcontroller 34 of the communication device 30B may set the identifier ID of the communication device 30B to "102", based on the control signal CTL1 of the communication device 30B, the setting flag F of the communication device 30B, and the setting command CMD102 (part (G) in FIG. 9). In this example, the control signal CTL1 of the communication device 30B may be at the high level because being the same as the control signal CTL2 of the communication device 30A (part (F) in FIG. 9), and the setting flag F of the communication device 30B may be at "0" (part (H) in FIG. 9). Accordingly, the microcontroller 34 of the communication device 30B may set the identifier ID of the communication device 30B to "102", based on the setting command CMD102.

Thereafter, at the timing t34, the microcontroller 34 of the communication device 30B may set the setting flag F to "1" (part (H) in FIG. 9). In this example, upon setting the identifier ID of the communication device 30B, the microcontroller 34 of the communication device 30B may set the setting flag F of the communication device 30B to "1".

Further, at the timing t34, the signal generation circuit 36 of the communication device 30B may set the control signal CTL2 to the high level (part (I) in FIG. 9).

In this way, as illustrated in FIG. 5C, the identifier ID of the communication device 30B of the communication system 10 may be set to "102" corresponding to the setting command CMD102. Further, the control signal CTL2 of the communication device 30B may be set to the high level. This may cause the control signal CTL1 of the communication device 30C positioned in the next stage of the communication device 30B to be at the high level. The identifier ID of the communication device 30C may remain at the initial value (of "1").

The communication system 10 may repeat the operation described above. As a result, the respective identifiers ID of the communication devices 30A to 30H of the communication system 10 may be set to "101" to "108", as illustrated in FIG. 5D. Thereafter, the microcontroller 34 of each of the communication devices 30A to 30H may write the identifier ID and the setting flag F of relevant one of the communication devices 30A to 30H in the storage circuit 35.

Modification Example 1-3

Figure 10:
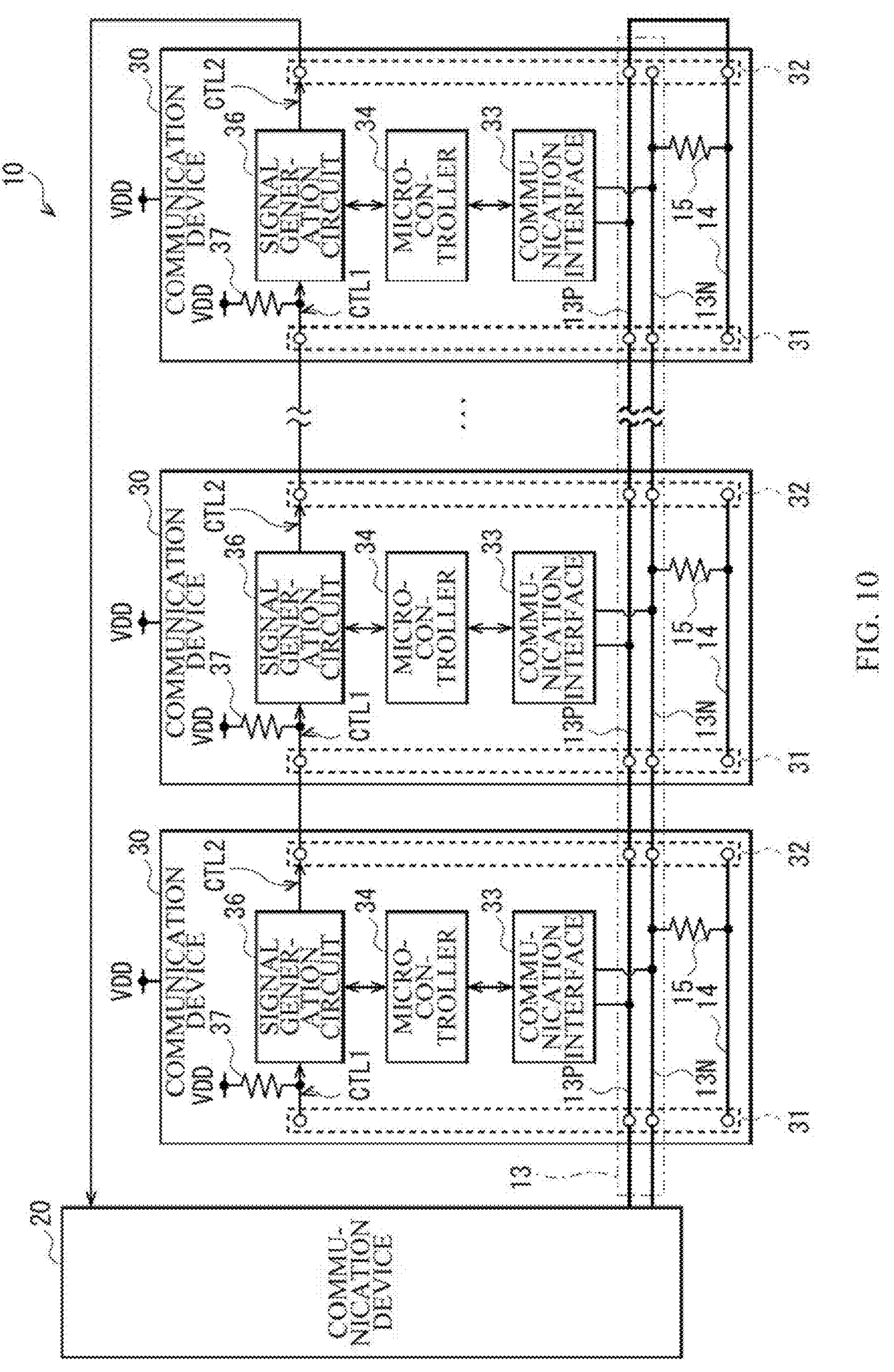
FIG. 10 is a circuit diagram illustrating a configuration example of a communication system according to still another modification example of the example embodiment illustrated in FIG. 3.

In the foregoing example embodiment, as illustrated in FIG. 3, the control signal CTL2 generated by the communication device 30 positioned in the last stage may not be supplied to any other device; however, this is non-limiting. In some embodiments, as illustrated in FIG. 10, the control signal CTL2 of the communication device 30 positioned in the last stage may be supplied to the communication device 20. This allows the communication device 20 according to the present modification example to grasp that the respective identifiers ID have been set in all the communication devices 30, based on the control signal CTL2 supplied from the communication device 30 positioned in the last stage. Accordingly, for example, the communication device 20 is allowed to transmit setting commands in order from the setting command CMD101 similarly to that of the foregoing example embodiment (FIG. 4) and to stop transmitting the setting commands when the control signal CTL2 supplied from the communication device 30 positioned in the last stage has changed from the low level to the high level. Such a configuration helps to allow the communication system 10 to set the respective identifiers ID of all the communication devices 30 even when the communication device 20 does not grasp the number of the communication devices 30 in the communication system 10, for example.

Other Modification Examples

In some embodiments, any two or more of these modification examples may be combined with each other.

2. Second Example Embodiment

Next, a description will be given of a communication system 40 according to a second example embodiment. In the present example embodiment, power supply signals may be used to determine a communication device of which the identifier ID is to be set. In other words, unlike in the first example embodiment described above (FIG. 3) in which the determination of a communication device of which the identifier ID is to be set is made based on the control signals, in the present example embodiment, the determination of a communication device of which the identifier ID is to be set may be made based on the power supply signals. Note that components substantially the same as those in the communication system 10 according to the first example embodiment described above are denoted by the same reference numerals and will not be described in detail.

Figure 11:
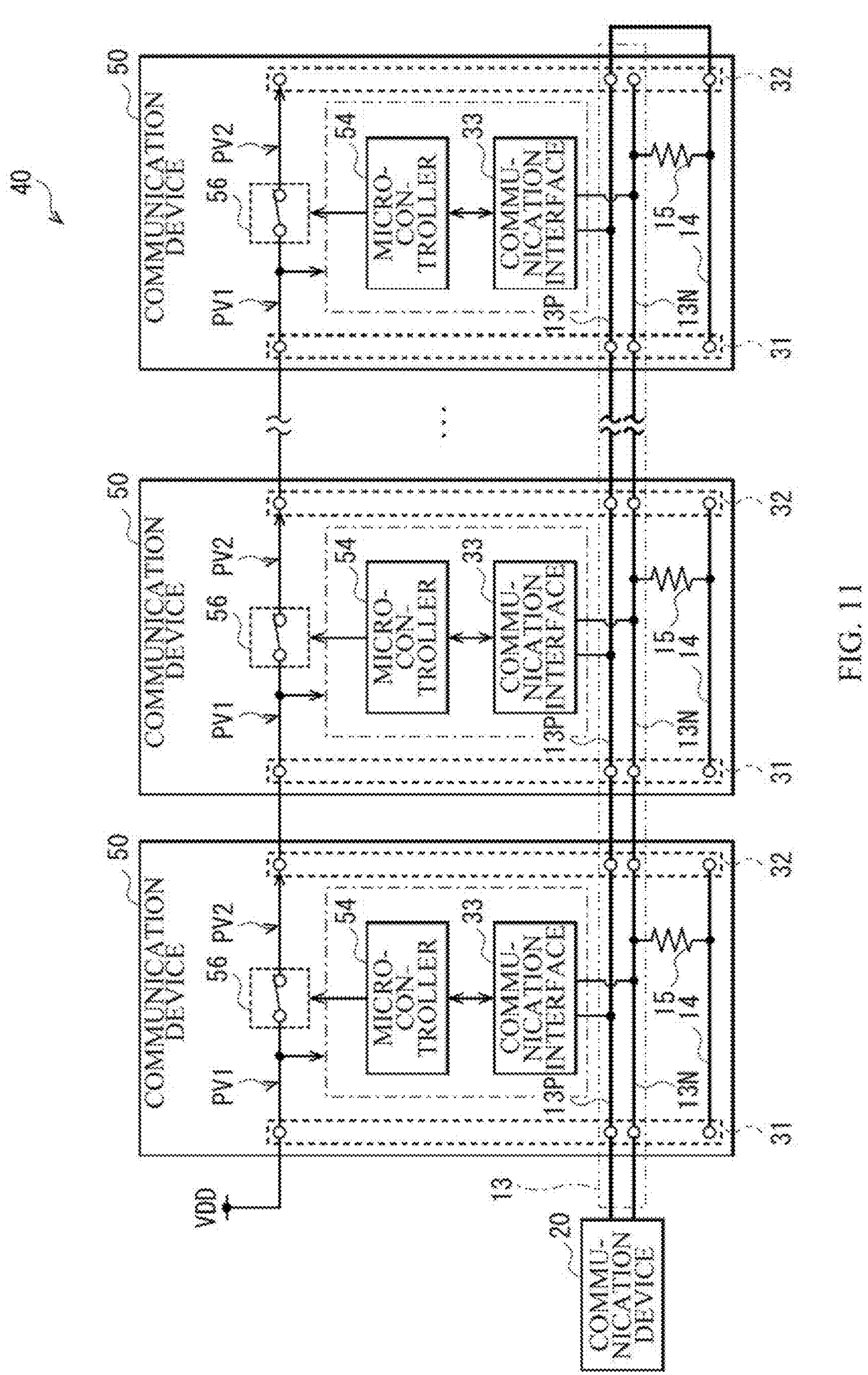
FIG. 11 is a circuit diagram illustrating a configuration example of a communication system according to one example embodiment of the disclosure.

FIG. 11 illustrates a configuration example of the communication system 40. The communication system 40 may include the communication device 20, multiple communication devices 50 (communication devices 50A to 50H), and the communication bus 13.

Figure 12:
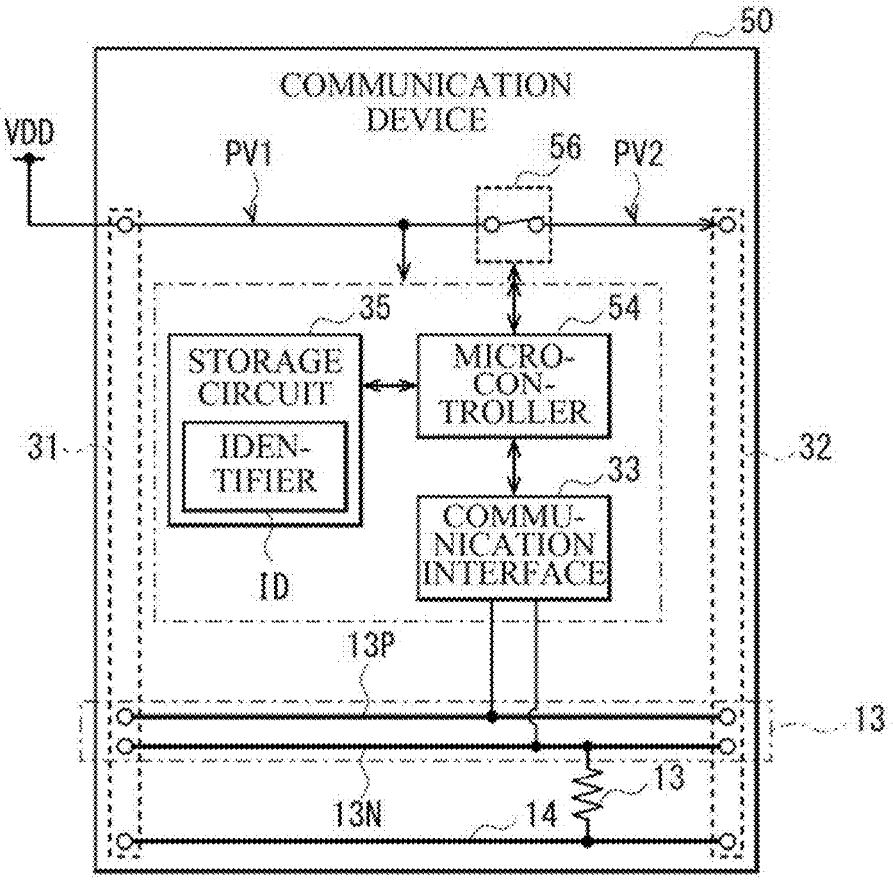
FIG. 12 is a circuit diagram illustrating a configuration example of a communication device illustrated in FIG. 11.

FIG. 12 illustrates a configuration example of the communication device 50. The communication device 50 includes a microcontroller 54 and a switch 56. The microcontroller 54 may be configured to control an operation of the communication device 50. The microcontroller 54 may further be configured to control an operation of the switch 56. The switch 56 may have a first end coupled to one of the terminals provided at the connector 31, and a second end coupled to one of the terminals provided at the connector 32. The switch 56 may be turned on and off based on a signal supplied from the microcontroller 54. When being brought into an on state, the switch 56 may output a power supply signal PV1 received at the first end of the switch 56, as a power supply signal PV2. The communication interface 33, the microcontroller 54, and the storage circuit 35 may each be supplied with the power supply signal PV1.

As illustrated in FIG. 11, the multiple communication devices 50 may be daisy-chained. For example, the switch 56 of each of the multiple communication devices 50 other than the communication device 50 positioned in the last stage may supply the power supply signal PV2 as the power supply signal PV1 to the communication device 50 positioned in the next stage. The communication device 50 positioned in the first stage may be supplied with the power supply voltage VDD as the power supply signal PV1.

Here, the switch 56 may correspond to a specific but non-limiting example of the "signal generation circuit" in one embodiment of the disclosure. The microcontroller 54 may correspond to a specific but non-limiting example of the "processing circuit" in one embodiment of the disclosure. The power supply signal PV1 may correspond to a specific but non-limiting example of the "first control signal" in one embodiment of the disclosure. The power supply signal PV2 may correspond to a specific but non-limiting example of the "second control signal" in one embodiment of the disclosure.

Figure 13:
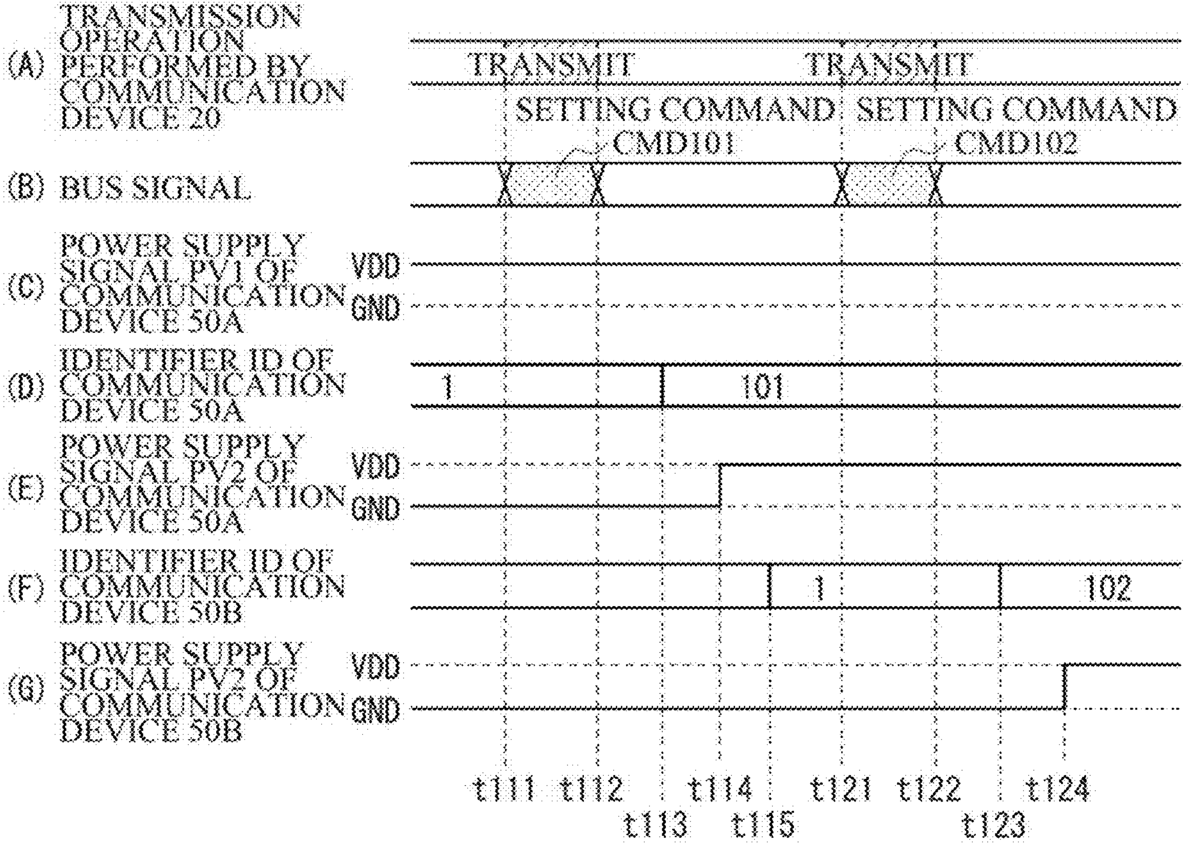
FIG. 13 is a timing diagram illustrating an operation example of the communication system illustrated in FIG. 11.

FIG. 13 illustrates an example of an operation of setting the identifiers ID in the communication system 40. In FIG. 13, part (A) illustrates a transmission operation performed by the communication device 20, part (B) illustrates a bus signal of the communication bus 13, part (C) illustrates a waveform of the power supply signal PV1 of the communication device 50A, part (D) illustrates the identifier ID of the communication device 50A, part (E) illustrates a waveform of the power supply signal PV2 of the communication device 50A, part (F) illustrates the identifier ID of the communication device 50B, and part (G) illustrates a waveform of the power supply signal PV2 of the communication device 50B. FIGS. 14A to 14D each illustrate respective operation states of the multiple communication devices 50. In FIGS. 14A to 14D, each of the switches 56 is illustrated with a symbol indicating an open or closed state.

Figure 14A:
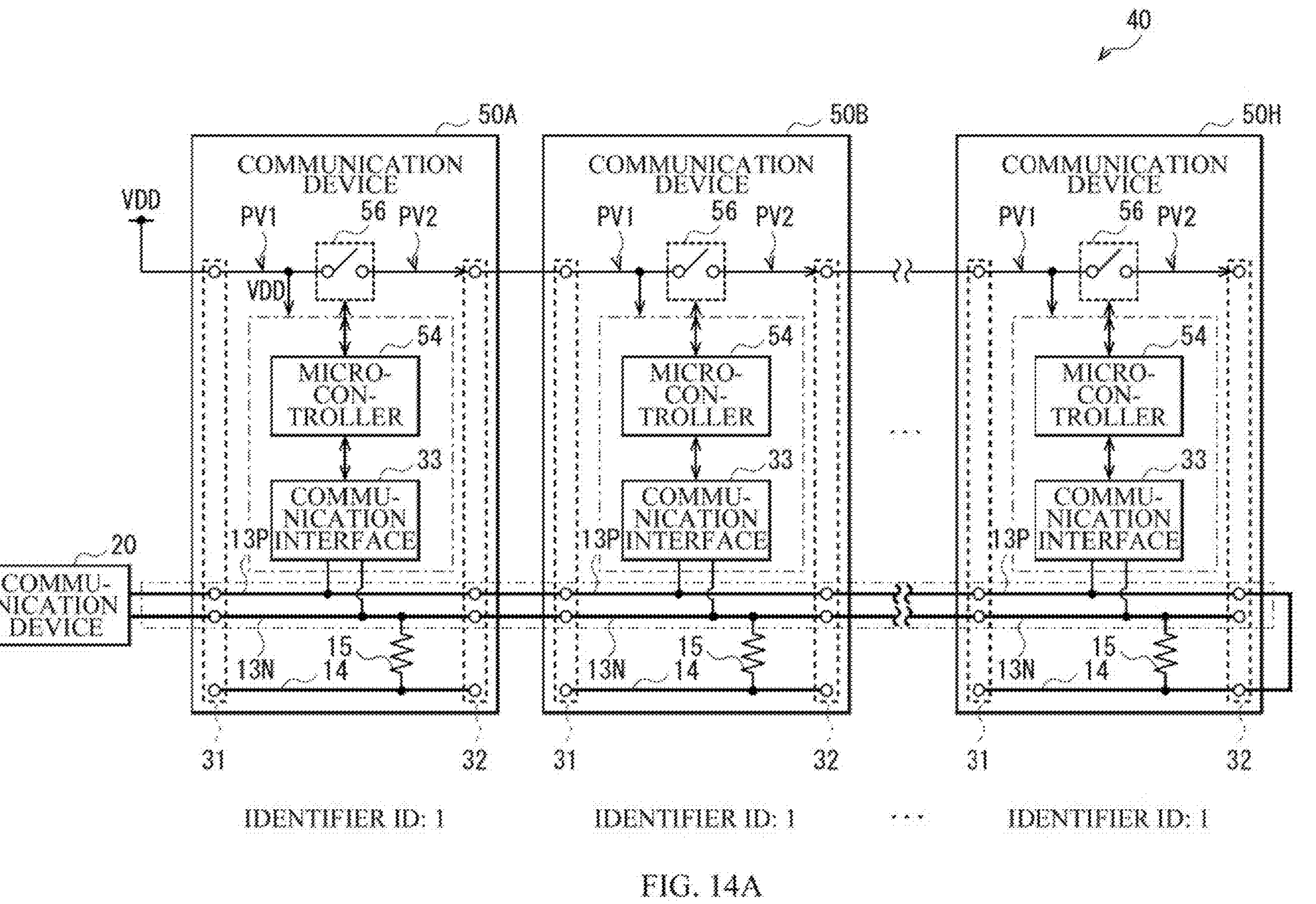
FIG. 14A is an explanatory diagram illustrating an operation state of the communication system illustrated in FIG. 11.

In this example, as illustrated in FIG. 14A, the identifier ID of each of the communication devices 50A to 50H may be already initialized and be at "1". The communication device 50A may be supplied with the power supply voltage VDD as the power supply signal PV1. The switch 56 of each of the communication devices 50A to 50H may be in an off state. Accordingly, the communication devices 50B to 50H may not each be supplied with the power supply voltage VDD.

As illustrated in FIG. 13, in a time period from a timing t111 to a timing t112, the communication device 20 may transmit the setting command CMD101 via the communication bus 13 (parts (A) and (B) in FIG. 13). The communication interface 33 of the communication device 50A may receive the setting command CMD101. Not having been supplied with the power supply voltage VDD, the communication devices 50B to 50H may not each receive the setting command CMD101.

Thereafter, at a timing t113, the microcontroller 54 of the communication device 50A may set the identifier ID of the communication device 50A to "101", based on the power supply signal PV1 of the communication device 50A (part (C) in FIG. 13), the identifier ID of the communication device 50A (part (D) in FIG. 13), and the setting command CMD101. In this example, the microcontroller 54 of the communication device 50A may be operable because the communication device 50A is supplied with the power supply voltage VDD as the power supply signal PV1 (part (C) in FIG. 13), and the identifier ID of the communication device 50A immediately before the timing t113 may be at the initial value (of "1"). Accordingly, the microcontroller 54 of the communication device 50A may set the identifier ID of the communication device 50A to "101", based on the setting command CMD101.

Thereafter, at a timing t114, the switch 56 of the communication device 50A may change from the off state to the on state to output the power supply voltage VDD as the power supply signal PV2 (part (E) in FIG. 13). In this example, upon setting the identifier ID of the communication device 50A, the microcontroller 54 of the communication device 50A may activate the switch 56. The switch 56 may thus change from the off state to the on state. This may cause the switch 56 to output the power supply voltage VDD as the power supply signal PV2. As a result, the power supply voltage VDD may be supplied as the power supply signal PV1 to the communication device 50B positioned in the next stage of the communication device 50A to thereby start the communication device 50B.

Thereafter, at a timing t115, the communication device 50B may set the identifier ID of the communication device 50B to "1" by reading the identifier ID from the storage circuit 35 (part (F) in FIG. 13).

Figure 14B:
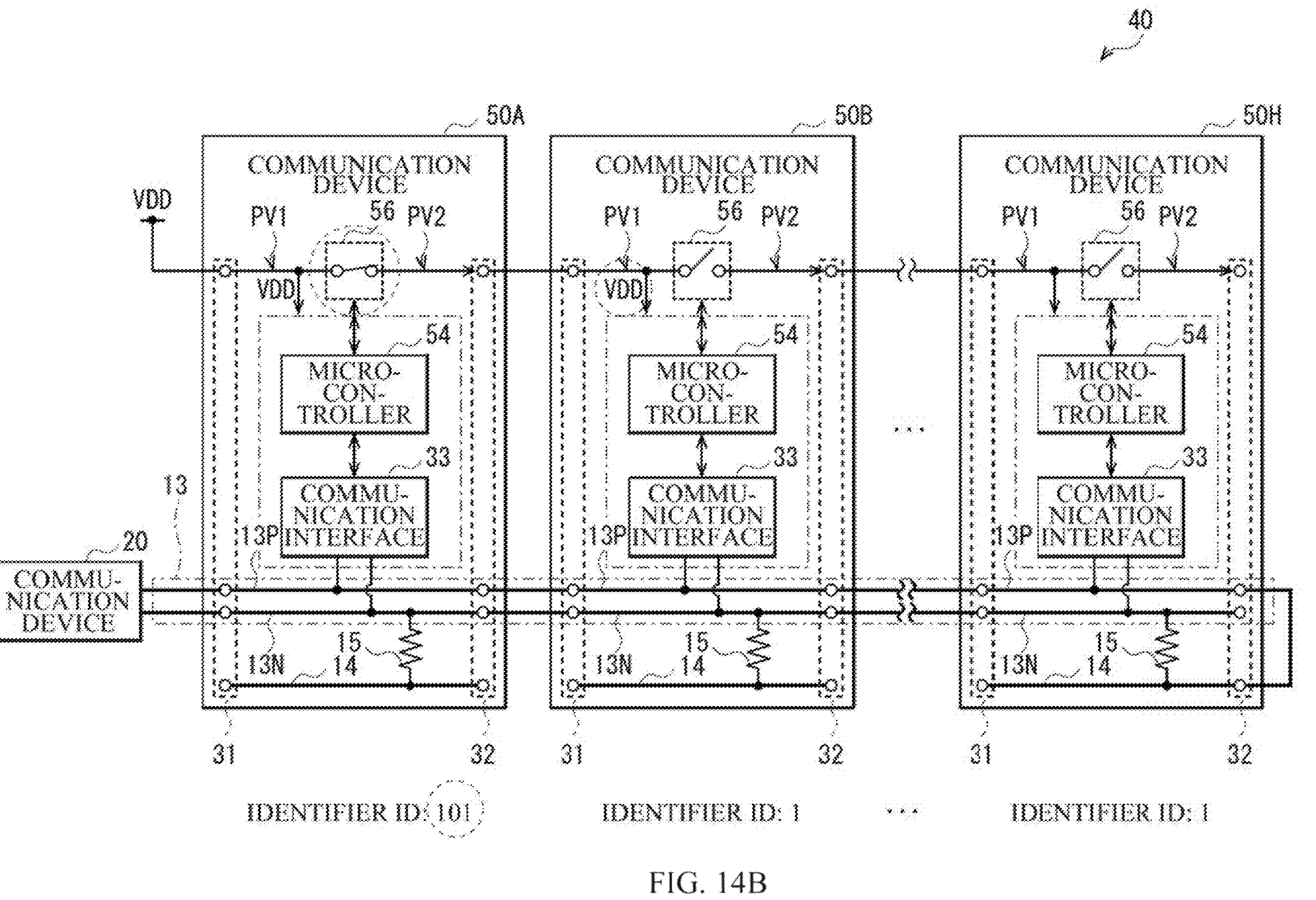
FIG. 14B is an explanatory diagram illustrating another operation state of the communication system illustrated in FIG. 11.

In this way, as illustrated in FIG. 14B, the identifier ID of the communication device 50A of the communication system 40 may be set to "101" corresponding to the setting command CMD101. Further, because the switch 56 of the communication device 50A has been brought into the on state, the power supply voltage VDD may be supplied to the communication device 50B positioned in the next stage of the communication device 50A to thereby start the communication device 50B. The identifier ID of the communication device 50B may remain at the initial value (of "1").

Thereafter, as illustrated in FIG. 13, in a time period from a timing t121 to a timing t122, the communication device 20 may transmit the setting command CMD102 via the communication bus 13 (parts (A) and (B) in FIG. 13). The communication interface 33 of each of the communication devices 50A and 50B may receive the setting command CMD102. Not having been supplied with the power supply voltage VDD, the communication devices 50C to 50H may not each receive the setting command CMD102.

Thereafter, at a timing t123, the microcontroller 54 of the communication device 50B may set the identifier ID of the communication device 50B to "102", based on the power supply signal PV1 of the communication device 50B, the identifier ID of the communication device 50B, and the setting command CMD102 (part (F) in FIG. 13). In this example, the microcontroller 54 of the communication device 50B may be operable because the communication device 50B has been supplied with the power supply signal PV2 outputted from the communication device 50A as the power supply signal PV1 (part (E) in FIG. 13), and the identifier ID of the communication device 50B immediately before the timing t123 may be at the initial value (of "1"). Accordingly, the microcontroller 54 of the communication device 50B may set the identifier ID of the communication device 50B to "102", based on the setting command CMD102.

Thereafter, at a timing t124, the switch 56 of the communication device 50B may change from the off state to the on state to output the power supply voltage VDD as the power supply signal PV2 (part (G) in FIG. 13). In this example, upon setting the identifier ID of the communication device 50B, the microcontroller 54 of the communication device 50B may activate the switch 56. The switch 56 may thus change from the off state to the on state. This may cause the switch 56 to output the power supply voltage VDD as the power supply signal PV2. As a result, the power supply voltage VDD may be supplied as the power supply signal PV1 to the communication device 50C positioned in the next stage of the communication device 50B to thereby start the communication device 50C.

Figure 14C:
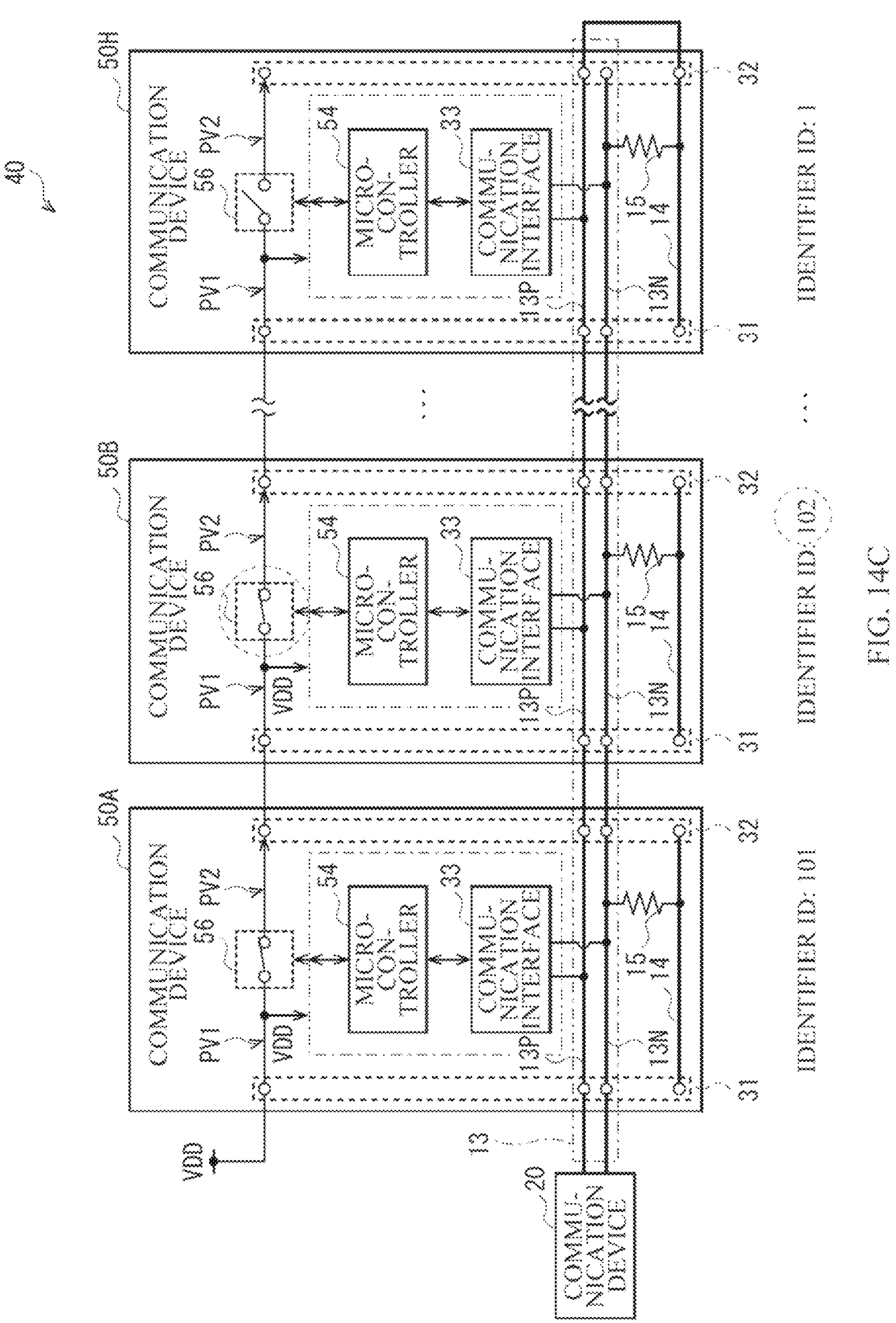
FIG. 14C is an explanatory diagram illustrating still another operation state of the communication system illustrated in FIG. 11.

In this way, as illustrated in FIG. 14C, the identifier ID of the communication device 50B of the communication system 40 may be set to "102" corresponding to the setting command CMD102. Further, because the switch 56 of the communication device 50B has been brought into the on state, the power supply voltage VDD may be supplied to the communication device 50C positioned in the next stage of the communication device 50B.

Figure 14D:
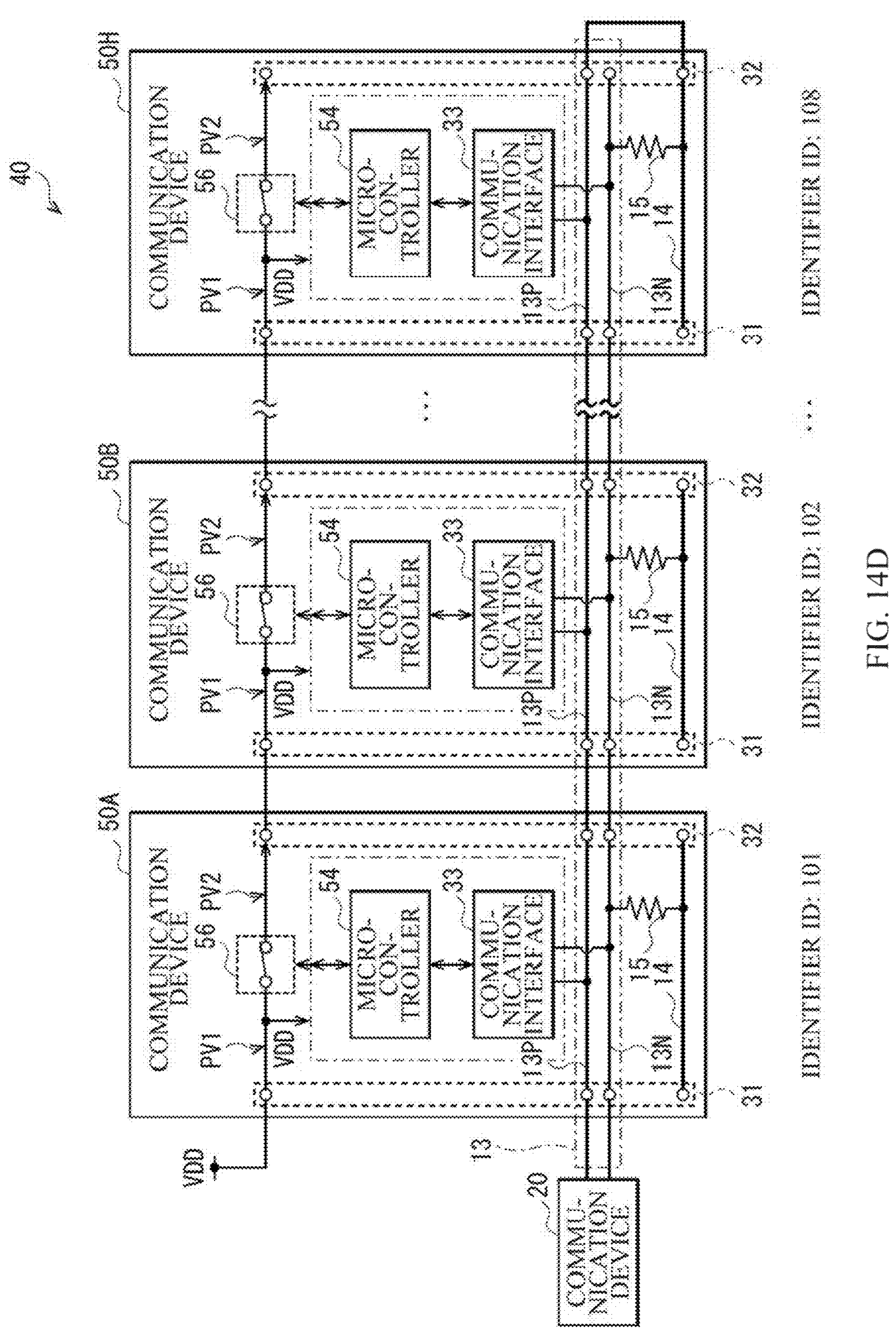
FIG. 14D is an explanatory diagram illustrating yet another operation state of the communication system illustrated in FIG. 11.

The communication system 40 may repeat the operation described above. As a result, the respective identifiers ID of the communication devices 50A to 50H of the communication system 40 may be set to "101" to "108", as illustrated in FIG. 14D. Thereafter, the microcontroller 54 of each of the communication devices 50A to 50H may write the identifier ID of relevant one of the communication devices 50A to 50H in the storage circuit 35.

As described above, the first control signal (the power supply signal PV1) and the second control signal (the power supply signal PV2) of the communication device 50 may each be a power supply signal. The processing circuit (the microcontroller 54) may be operable based on the first control signal (the power supply signal PV1). The first logic level may be a power supply voltage level, and the second logic level may be a ground voltage level. Such a configuration helps to determine a communication device of which the identifier ID is to be set, based on the power supply signals carrying the power supply voltage VDD instead of the dedicated control signals CTL1 and CTL2 used in the first example embodiment described above. This helps to decrease the number of the control signals of the communication device 50, allowing for setting of the identifier ID in a simple way.

As described above, according to the present example embodiment, the first control signal and the second control signal may each be a power supply signal. The processing circuit may be operable based on the first control signal. The first logic level may be the power supply voltage level, and the second logic level may be the ground voltage level. Such a configuration helps to allow for setting of the identifier ID in a simple way. The present example embodiment may have other example effects similar to those of the first example embodiment described above.

Modification Example 2

Any of the modification examples of the first example embodiment described above may be applied to the second example embodiment described above.

3. Third Example Embodiment

Next, a description will be given of a communication system 80 according to a third example embodiment. In the present example embodiment, communication devices other than the communication device 20 may each be configured to transmit a setting command. Note that components substantially the same as those in the communication system 10 according to the first example embodiment described above are denoted by the same reference numerals and will not be described in detail.

Figure 15:
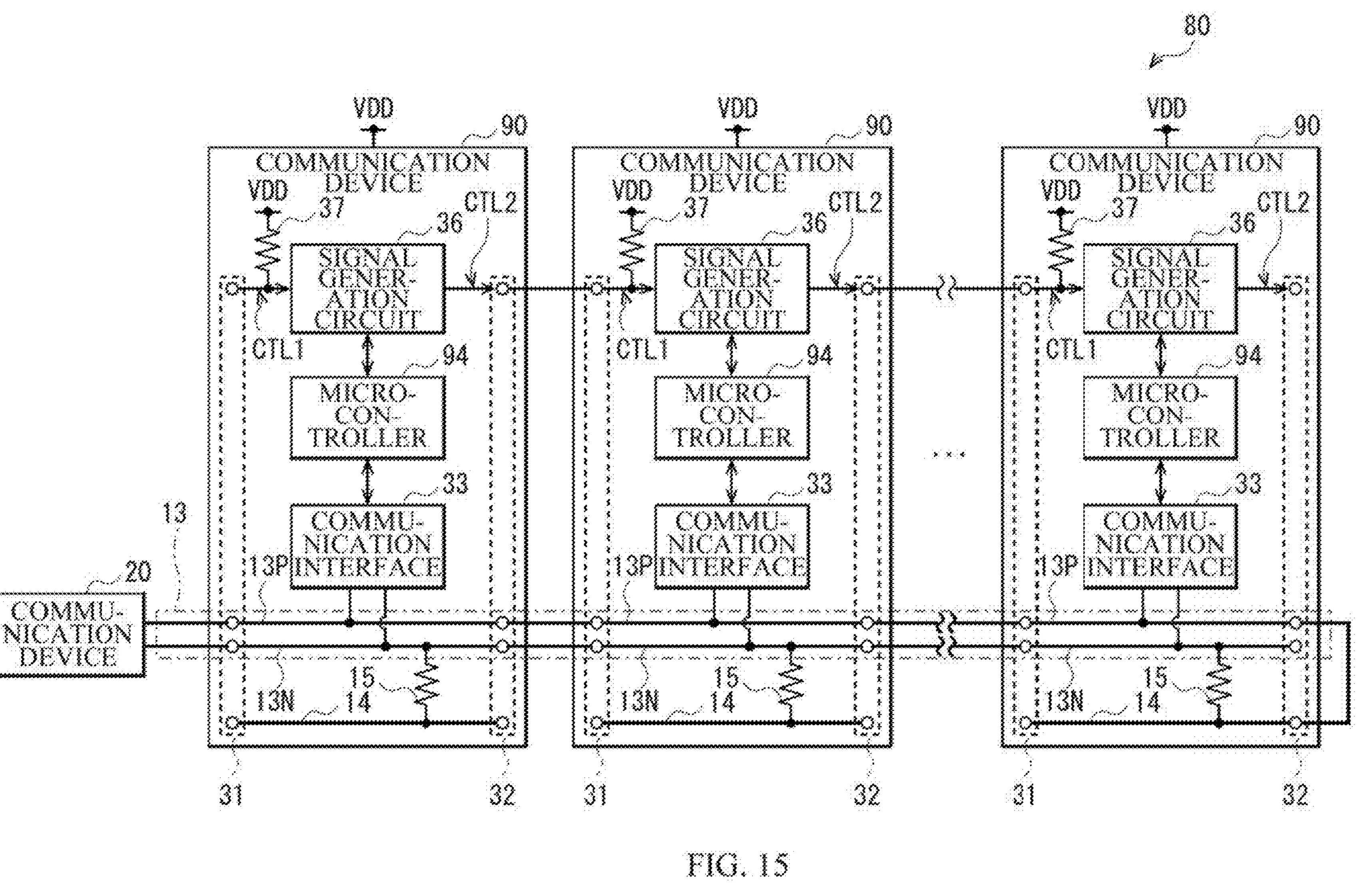
FIG. 15 is a circuit diagram illustrating a configuration example of a communication system according to one example embodiment of the disclosure.

FIG. 15 illustrates a configuration example of the communication system 80. The communication system 80 may include the communication device 20, multiple communication devices 90 (communication devices 90A to 90H), and the communication bus 13.

Figure 16:
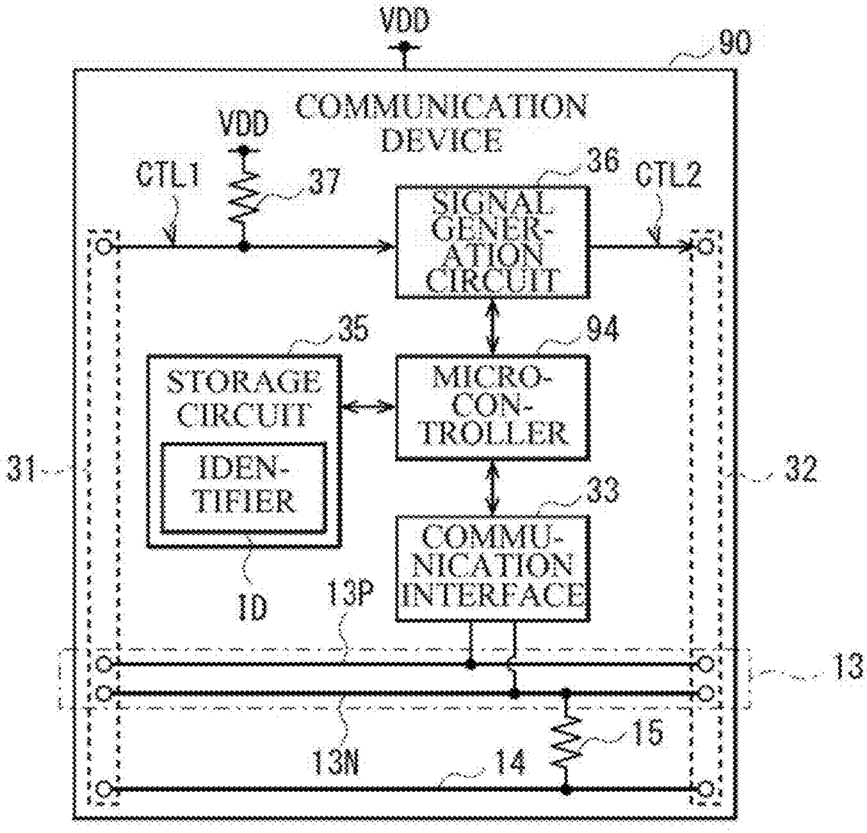
FIG. 16 is a circuit diagram illustrating a configuration example of a communication device illustrated in FIG. 15.

FIG. 16 illustrates a configuration example of the communication device 90. The communication device 90 includes a microcontroller 94. The microcontroller 94 may be configured to, after setting the identifier ID of the communication device 90, transmit a setting command to be received by the communication device 90 positioned in the next stage.

FIG. 17 illustrates an example of an operation of setting the identifiers ID in the communication system 80. In FIG. 17, part (A) illustrates a transmission operation performed by the communication device 20, part (B) illustrates a bus signal of the communication bus 13, part (C) illustrates a waveform of the control signal CTL1 of the communication device 90A, part (D) illustrates a transmission operation performed by the communication device 90A, part (E) illustrates the identifier ID of the communication device 90A, part (F) illustrates a waveform of the control signal CTL2 of the communication device 90A, part (G) illustrates a transmission operation performed by the communication device 90B, part (H) illustrates the identifier ID of the communication device 90B, and part (I) illustrates a waveform of the control signal CTL2 of the communication device 90B.

First, as illustrated in FIG. 17, in a time period from a timing t311 to a timing t312, the communication device 20 may transmit the initialization command CMD1 via the communication bus 13 (parts (A) and (B) in FIG. 17). The communication interface 33 of each of the communication devices 90A to 90H may receive the initialization command CMD1.

Thereafter, at a timing t313, the microcontroller 94 of each of the communication devices 90A to 90H may set the identifier ID to the predetermined initial value (of "1" in this example), based on the initialization command CMD1 (parts (E) and (H) in FIG. 17).

Thereafter, at a timing t314, the signal generation circuit 36 of each of the communication devices 90A to 90H may set the control signal CTL2 to the low level (parts (F) and (I) in FIG. 17).

In this way, the respective eight identifiers ID of the communication devices 90A to 90H of the communication system 80 may each be set to the initial value (of "1" in this example), similarly to a case of the communication system 10 according to the first example embodiment (FIG. 5A). Further, the respective eight control signals CTL2 of the communication devices 90A to 90H may each be set to the low level. This may cause the respective control signals CTL1 of the communication devices 90B to 90H to each be at the low level. The control signal CTL1 of the communication device 90A may be at the high level.

Thereafter, in a time period from a timing t321 to a timing t322, the communication device 20 may transmit the setting command CMD101 via the communication bus 13 (parts (A) and (B) in FIG. 17). The communication interface 33 of each of the communication devices 90A to 90H may receive the setting command CMD101.

Thereafter, at a timing t323, the microcontroller 94 of the communication device 90A may set the identifier ID of the communication device 90A to "101", based on the control signal CTL1 of the communication device 90A (part (C) in FIG. 17), the identifier ID of the communication device 90A (part (E) in FIG. 17), and the setting command CMD101.

Thereafter, at a timing t324, the signal generation circuit 36 of the communication device 90A may set the control signal CTL2 to the high level (part (F) in FIG. 17).

In this way, the identifier ID of the communication device 90A of the communication system 80 may be set to "101" corresponding to the setting command CMD101, similarly to the case of the communication system 10 according to the first example embodiment (FIG. 5B). Further, the control signal CTL2 of the communication device 90A may be set to the high level. This may cause the control signal CTL1 of the communication device 90B positioned in the next stage of the communication device 90A to be at the high level. The identifier ID of the communication device 90B may remain at the initial value (of "1").

Thereafter, in a time period from a timing t331 to a timing t332, the communication device 90A may transmit the setting command CMD102 via the communication bus 13 (parts (B) and (D) in FIG. 17). In this example, upon setting the identifier ID, the microcontroller 94 of the communication device 90A may generate the setting command CMD102, and the communication interface 33 may transmit the setting command CMD102 via the communication bus 13. The communication interface 33 of each of the communication devices 90B to 90H may receive the setting command CMD102.

Thereafter, at a timing t333, the microcontroller 94 of the communication device 90B may set the identifier ID of the communication device 90B to "102", based on the control signal CTL1 of the communication device 90B, the identifier ID of the communication device 90B, and the setting command CMD102 (part (H) in FIG. 17).

Thereafter, at a timing t334, the signal generation circuit 36 of the communication device 90B may set the control signal CTL2 to the high level (part (I) in FIG. 17).

In this way, the identifier ID of the communication device 90B of the communication system 80 may be set to "102" corresponding to the setting command CMD102, similarly to the case of the communication system 10 according to the first example embodiment (FIG. 5C). Further, the control signal CTL2 of the communication device 90B may be set to the high level. This may cause the control signal CTL1 of the communication device 90C positioned in the next stage of the communication device 90B to be at the high level. The identifier ID of the communication device 90C may remain at the initial value (of "1").

Thereafter, in a time period from a timing t341 to a timing t342, the communication device 90B may transmit a setting command CMD103 via the communication bus 13 (parts (B) and (G) in FIG. 17). In this example, upon setting the identifier ID, the microcontroller 94 of the communication device 90B may generate the setting command CMD103. The setting command CMD103 may instruct to set the identifier ID to "103". Thereafter, the communication interface 33 of the communication device 90B may transmit the setting command CMD103 via the communication bus 13. The communication interface 33 of each of the communication devices 90A and 90C to 90H may receive the setting command CMD103.

Thereafter, although not illustrated, the microcontroller 94 of the communication device 90C may set the identifier ID of the communication device 90C to "103", based on the control signal CTL1 of the communication device 90C, the identifier ID of the communication device 90C, and the setting command CMD103.

The communication system 80 may repeat the operation described above. As a result, the respective identifiers ID of the communication devices 90A to 90H of the communication system 80 may be set to "101" to "108", similarly to the case of the communication system 10 according to the first example embodiment (FIG. 5D). Thereafter, the microcontroller 94 of each of the communication devices 90A to 90H may write the identifier ID of relevant one of the communication devices 90A to 90H in the storage circuit 35.

As described above, the processing circuit (the microcontroller 94) of each of the multiple communication devices 90 may be configured to generate the identifier setting command corresponding to any of the multiple communication devices 90 of which the identifier ID has not yet been set. The communication interface 33 may be configured to transmit the identifier setting command generated by the processing circuit (the microcontroller 94) via the communication bus. In this way, in the communication system 80, the microcontroller 94 may be configured to transmit the identifier setting command. This helps to decrease the number of times of transmission of the identifier setting command performed by the communication device 20 to each of the multiple communication devices 90. This allows for a simple operation of the communication device 20 of the communication system 80, which helps to, for example, achieve a reduction in time and effort to create a program to be executed by the communication device 20.

As described above, according to the present example embodiment, the processing circuit may be configured to generate the identifier setting command corresponding to any of the communication devices of which the identifier has not yet been set. The communication interface may be configured to transmit the identifier setting command generated by the processing circuit via the communication bus.

Such a configuration helps to reduce the time and effort to create the program. The present example embodiment may have other example effects similar to those of the first example embodiment described above.

Modification Example 3

Any of the modification examples of the first example embodiment described above may be applied to the third example embodiment described above. Further, a technique according to the second example embodiment described above may be combined with a technique according to the third example embodiment described above.

The disclosure has been described hereinabove with reference to the example embodiments and the modification examples. However, the disclosure is not limited to the example embodiments and the modification examples, and may be modified in a variety of ways.

For example, in the foregoing example embodiment, the communication device 30 may have the circuit configuration illustrated in, for example, FIG. 2; however, this is non-limiting. For example, the communication device 30 may be provided with the resistor 37; however, this is non-limiting. In some embodiments, the resistor 37 may not be provided. Further, the communication device 30 may set the identifier ID when the control signal CTL1 is at the high level; however, this is non-limiting. In some embodiments, the communication device 30 may set the identifier ID when the control signal CTL1 is at the low level. Furthermore, the communication device 30 may be provided with the signal line 14; however, this is non-limiting. In some embodiments, the signal line 14 may not be provided. A configuration similar to any of the above configurations may apply to the communication device 50 (FIG. 12) and the communication device 90 (FIG. 16).

For example, in the foregoing example embodiment, as illustrated in FIG. 2, the microcontroller 34 and the storage circuit 35 may be provided separately; however, this is non-limiting. In some embodiments, the microcontroller 34 may include the storage circuit 35. In such embodiments, a circuit part of the microcontroller 34 excluding the storage circuit 35 may correspond to a specific but non-limiting example of the "processing circuit" in one embodiment of the disclosure.

For example, in the foregoing example embodiments, the storage circuit 35 may be a nonvolatile storage; however, this is non-limiting. In some embodiments, the storage circuit 35 may be a volatile storage.

The disclosure encompasses any possible combination of some or all of the various embodiments and the modification examples described herein and incorporated herein. It is possible to achieve at least the following configurations from the foregoing example embodiments and modification examples of the disclosure.

(1) A communication device including:
- a signal generation circuit configured to, based on a first control signal including a first logic level and a second logic level, generate a second control signal including the first logic level and the second logic level;
- a communication interface coupled to a communication bus, the communication interface being configured to receive an identifier setting command instructing to set an identifier of the communication device; and
- a processing circuit configured to set the identifier, based on the identifier setting command, when the first control signal is at the first logic level and the identifier has not yet been set based on the identifier setting command, in which
- the signal generation circuit is configured to
  - set the second control signal to the second logic level, when the processing circuit has not yet set the identifier, based on the identifier setting command, and
  - set the second control signal to the first logic level, after the processing circuit sets the identifier, based on the identifier setting command.

(2) The communication device according to (1), in which the processing circuit is configured to determine whether the identifier has been set based on the identifier setting command, by checking whether the identifier is at a predetermined initial value.

(3) The communication device according to (1), in which the processing circuit is configured to store flag data indicating whether the identifier has been set based on the identifier setting command.

(4) The communication device according to any one of (1) to (3), in which
- the first control signal and the second control signal each include a power supply signal,
- the processing circuit is operable based on the first control signal,
- the first logic level includes a power supply voltage level, and
- the second logic level includes a ground voltage level.

(5) The communication device according to any one of (1) to (4), in which
- the processing circuit is configured to generate an identifier setting command instructing to set an identifier of another communication device, and
- the communication interface is configured to transmit the identifier setting command generated by the processing circuit via the communication bus.

(6) A communication system including:
- a communication bus; and
- multiple communication devices each coupled to the communication bus,
- each of the multiple communication devices including
  - a signal generation circuit configured to, based on a first control signal including a first logic level and a second logic level, generate a second control signal including the first logic level and the second logic level,
  - a communication interface coupled to the communication bus, the communication interface being configured to receive an identifier setting command instructing to set an identifier of relevant one of the multiple communication devices, and
  - a processing circuit configured to set the identifier, based on the identifier setting command, when the first control signal is at the first logic level and the identifier has not yet been set based on the identifier setting command, in which
- the signal generation circuit of each of the multiple communication devices is configured to
  - set the second control signal to the second logic level, when the processing circuit has not yet set the identifier, based on the identifier setting command, and
  - set the second control signal to the first logic level, after the processing circuit sets the identifier, based on the identifier setting command, and the signal generation circuit of each of one or more communication devices other than a predetermined communication device, among the multiple communication devices, is configured to supply the second control signal as the first control signal to the signal generation circuit of one of the multiple communication devices other than relevant one of the one or more communication devices.

(7) The communication system according to (6), further including a control communication device coupled to the communication bus, the control communication device being configured to sequentially transmit a plurality of the identifier setting commands via the communication bus, the identifier setting commands corresponding to respective ones of the multiple communication devices.

(8) The communication system according to (7), in which the control communication device is configured to stop transmitting the identifier setting commands, based on the second control signal generated by the signal generation circuit of the predetermined communication device.

(9) The communication system according to (6), in which the processing circuit of each of the one or more communication devices is configured to generate the identifier setting command corresponding to any of the multiple communication devices of which the identifier has not yet been set based on the identifier setting command, and the communication interface of each of the one or more communication devices is configured to transmit the identifier setting command generated by the processing circuit via the communication bus.

A communication device and a communication system according to at least one embodiment of the disclosure each make it possible to set an identifier in a simple way.

The effects described herein are mere examples, and effects of an embodiment of the disclosure are not limited thereto. Accordingly, any other effect may be obtained in relation to the embodiment of the disclosure.

Although the disclosure has been described hereinabove in terms of the example embodiment and modification examples, the disclosure is not limited thereto. It should be appreciated that variations may be made in the described example embodiment and modification examples by those skilled in the art without departing from the scope of the disclosure as defined by the following claims.

The limitations in the claims are to be interpreted broadly based on the language employed in the claims and not limited to examples described in this specification or during the prosecution of the application, and the examples are to be construed as non-exclusive.

As used in this specification and the appended claims, the singular forms “a”, “an”, and “the” include, especially in the context of the claims, are to be construed to cover both the singular and the plural, unless otherwise indicated herein or clearly contradicted by context.

Throughout this specification and the appended claims, unless the context requires otherwise, the terms “comprise”, “include”, “have”, and their variations are to be construed to cover the inclusion of a stated element, integer or step but not the exclusion of any other non-stated element, integer or step.

The use of the terms first, second, etc. do not denote any order or importance, but rather the terms first, second, etc. are used to distinguish one element from another.

The term “substantially”, “approximately”, “about”, and its variants having the similar meaning thereto are defined as being largely but not necessarily wholly what is specified as understood by one of ordinary skill in the art.

The term “disposed on/provided on/formed on” and its variants having the similar meaning thereto as used herein refer to elements disposed directly in contact with each other or indirectly by having intervening structures therebetween.

What is claimed is:

1. A communication device comprising:

a signal generation circuit configured to, based on a first control signal including a first logic level and a second logic level, generate a second control signal including the first logic level and the second logic level;

a communication interface coupled to a communication bus, the communication interface being configured to receive an identifier setting command instructing to set an identifier of the communication device; and a processing circuit configured to set the identifier, based on the identifier setting command, when the first control signal is at the first logic level and the identifier has not yet been set based on the identifier setting command, wherein the signal generation circuit is configured to set the second control signal to the second logic level, when the processing circuit has not yet set the identifier, based on the identifier setting command, and set the second control signal to the first logic level, after the processing circuit sets the identifier, based on the identifier setting command.

2. The communication device according to claim 1, wherein the processing circuit is configured to determine whether the identifier has been set based on the identifier setting command, by checking whether the identifier is at a predetermined initial value.

3. The communication device according to claim 1, wherein the processing circuit is configured to store flag data indicating whether the identifier has been set based on the identifier setting command.

4. The communication device according to claim 1, wherein the first control signal and the second control signal each comprise a power supply signal, the processing circuit is operable based on the first control signal, the first logic level comprises a power supply voltage level, and the second logic level comprises a ground voltage level.

5. The communication device according to claim 1, wherein the processing circuit is configured to generate an identifier setting command instructing to set an identifier of another communication device, and the communication interface is configured to transmit the identifier setting command generated by the processing circuit via the communication bus.

6. A communication system comprising:

a communication bus; and multiple communication devices each coupled to the communication bus, each of the multiple communication devices including a signal generation circuit configured to, based on a first control signal including a first logic level and a second logic level, generate a second control signal including the first logic level and the second logic level, a communication interface coupled to the communication bus, the communication interface being configured to receive an identifier setting command instructing to set an identifier of a specific one of the multiple communication devices, and a processing circuit configured to set the identifier, based on the identifier setting command, when the first control signal is at the first logic level and the identifier has not yet been set based on the identifier setting command, wherein the signal generation circuit of each of the multiple communication devices is configured to set the second control signal to the second logic level, when the processing circuit has not yet set the identifier, based on the identifier setting command, and set the second control signal to the first logic level, after the processing circuit sets the identifier, based on the identifier setting command, and the signal generation circuit of each of one or more communication devices other than a predetermined communication device, among the multiple communication devices, is configured to supply the second control signal as the first control signal to the signal generation circuit of one of the multiple communication devices other than the specific one of the multiple communication devices.

7. The communication system according to claim 6, further comprising a control communication device coupled to the communication bus, the control communication device being configured to sequentially transmit a plurality of the identifier setting commands via the communication bus, the identifier setting commands corresponding to respective ones of the multiple communication devices.

8. The communication system according to claim 7, wherein the control communication device is configured to stop transmitting the identifier setting commands, based on the second control signal generated by the signal generation circuit of the predetermined communication device.

9. The communication system according to claim 6, wherein the processing circuit of each of the one or more communication devices is configured to generate the identifier setting command corresponding to any of the multiple communication devices of which the identifier has not yet been set based on the identifier setting command, and the communication interface of each of the one or more communication devices is configured to transmit the identifier setting command generated by the processing circuit via the communication bus.

* * * * *